United States Patent
Han et al.

(10) Patent No.: US 9,495,991 B2
(45) Date of Patent: *Nov. 15, 2016

(54) METHOD FOR FORMING SILICON OXIDE AND METAL NANOPATTERN'S, AND MAGNETIC RECORDING MEDIUM FOR INFORMATION STORAGE USING THE SAME

(71) Applicants: LG CHEM, LTD., Seoul (KR); IUCF-HYU (INDUSTRY-UNIVERSITY COOPERATION FOUNDATION HANYANG UNIVERSITY), Seoul (KR)

(72) Inventors: Yang Kyoo Han, Seoul (KR); Je Gwon Lee, Daejeon (KR); Hyun Jin Lee, Daejeon (KR); No Ma Kim, Daejeon (KR); Sung Soo Yoon, Daejeon (KR); Eun Ji Shin, Daejeon (KR); Yeon Sik Jung, Daejeon (KR)

(73) Assignees: LG CHEM, LTD., Seoul (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/419,616
(22) PCT Filed: Sep. 9, 2013
(86) PCT No.: PCT/KR2013/008027
§ 371 (c)(1),
(2) Date: Feb. 4, 2015
(87) PCT Pub. No.: WO2014/038869
PCT Pub. Date: Mar. 13, 2014

(65) Prior Publication Data
US 2015/0228298 A1 Aug. 13, 2015

(30) Foreign Application Priority Data
Sep. 10, 2012 (KR) .................. 10-2012-0100033

(51) Int. Cl.
*G11B 5/855* (2006.01)
*H01L 21/3065* (2006.01)
(Continued)

(52) U.S. Cl.
CPC ............ *G11B 5/855* (2013.01); *G03F 7/0002* (2013.01); *G11B 5/746* (2013.01); *G11B 5/8404* (2013.01);
(Continued)

(58) Field of Classification Search
CPC ..... G11B 5/855; G11B 5/8404; G11B 5/851; G11B 5/746; H01L 21/3065; H01L 21/027; G03F 7/0002; B81C 2201/0149; B81C 1/00396; B81C 2201/0198; C08F 2438/03; C08F 220/56; C08F 220/18; B82Y 40/00; B82Y 10/00

See application file for complete search history.

(56) References Cited

U.S. PATENT DOCUMENTS 6,565,763 B1    5/2003 Asakawa et al.
7,569,469 B2 *  8/2009 Kim ...................... H01L 21/312
                                              257/E21.001

(Continued)

FOREIGN PATENT DOCUMENTS

JP    2001-151834 A    6/2001
JP    2003-109210 A    4/2003

(Continued)

OTHER PUBLICATIONS

Synthesis of New Block Copolymers from n-Butyl Acrylate and DPAA by RAFT Polymerization and Their Properties; Feb. 2008.

*Primary Examiner* — Anita Alanko
(74) *Attorney, Agent, or Firm* — Dentons US LLP

(57) ABSTRACT

The present invention relates to a method for forming a silicon oxide nanopattern, in which the method can be used to easily form a nanodot or nanohole-type nanopattern, and a metal nanopattern formed by using the same can be properly applied to a next-generation magnetic recording medium for storage information, etc., a method for forming a metal nanopattern, and a magnetic recording medium for information storage using the same.

The method for forming a silicon oxide nanopattern includes the steps of forming a block copolymer thin film including specific hard segments and soft segments containing a (meth)acrylate-based repeating unit on silicon oxide of a substrate; conducting orientation of the thin film; selectively removing the soft segments from the block copolymer thin film; and conducting reactive ion etching of silicon oxide using the block copolymer thin film from which the soft segments are removed, as a mask to form a silicon oxide nanodot or nanohole pattern.

17 Claims, 11 Drawing Sheets

(51) Int. Cl.
    *G03F 7/00*     (2006.01)
    *G11B 5/84*     (2006.01)
    *G11B 5/851*     (2006.01)
    *H01L 21/027*     (2006.01)
    *G11B 5/74*     (2006.01)
    *B81C 1/00*     (2006.01)
    *B82Y 10/00*     (2011.01)
    *B82Y 40/00*     (2011.01)
    *C08F 220/18*     (2006.01)
    *C08F 220/56*     (2006.01)

(52) U.S. Cl.
    CPC ............. *G11B 5/851* (2013.01); *H01L 21/027* (2013.01); *H01L 21/3065* (2013.01); *B81C 1/00396* (2013.01); *B81C 2201/0149* (2013.01); *B81C 2201/0198* (2013.01); *B82Y 10/00* (2013.01); *B82Y 40/00* (2013.01); *C08F 220/18* (2013.01); *C08F 220/56* (2013.01); *C08F 2438/03* (2013.01)

(56) References Cited

U.S. PATENT DOCUMENTS

| | | | |
|---|---|---|---|
| 8,053,163 | B2 | 11/2011 | Yi et al. |
| 8,518,837 | B2 * | 8/2013 | Russell ............... B81C 1/00031 438/486 |
| 2008/0176767 | A1 * | 7/2008 | Millward ............ B81C 1/00031 506/20 |
| 2009/0155725 | A1 | 6/2009 | Yi et al. |
| 2010/0022092 | A1 * | 1/2010 | Horiguchi ................. G03F 7/09 438/706 |
| 2011/0186544 | A1 * | 8/2011 | Endou ..................... B29C 71/02 216/58 |
| 2012/0009390 | A1 * | 1/2012 | Yang .................. B81C 1/00031 428/179 |
| 2012/0028476 | A1 * | 2/2012 | Li ....................... H01L 21/0338 438/780 |
| 2012/0164392 | A1 * | 6/2012 | Stoykovich ......... B81C 1/00031 428/172 |
| 2012/0301953 | A1 * | 11/2012 | Duan ..................... B82Y 30/00 435/287.9 |
| 2013/0313223 | A1 * | 11/2013 | Fujikawa ............ B81C 1/00031 216/13 |
| 2016/0064023 | A1 * | 3/2016 | Watanabe ................ G11B 5/66 360/110 |

FOREIGN PATENT DOCUMENTS

| | | |
|---|---|---|
| JP | 2004-303302 A | 10/2004 |
| JP | 2007125699 A | 5/2007 |
| JP | 2011-122081 A | 6/2011 |
| JP | 2012-142065 A | 7/2012 |
| KR | 10-2005-0033312 A | 4/2005 |
| KR | 10-0771886 B1 | 10/2007 |
| KR | 10-2010-0041946 A | 4/2010 |
| KR | 10-2010-0111525 A | 10/2010 |
| KR | 10-2010-0122002 A | 11/2010 |
| KR | 10-2011-0081519 A | 7/2011 |
| KR | 10-2012-0070302 A | 6/2012 |
| KR | 10-1163659 B1 | 7/2012 |
| KR | 10-2012-0119998 A | 11/2012 |

* cited by examiner

Top-down view (square array or hexagonal array)

Top-down view (square array or hexagonal array)

METHOD FOR FORMING SILICON OXIDE AND METAL NANOPATTERN'S, AND MAGNETIC RECORDING MEDIUM FOR INFORMATION STORAGE USING THE SAME

This application is a 35 USC §371 National Stage entry of International Application No. PCT/KR2013/008027, filed on Sep. 5, 2013, and claims priority to and the benefit of Korean Patent Application No. 10-2012-0100033, filed in the Korean Intellectual Property Office on Sep. 10, 2012, both of which are hereby incorporated by reference in their entireties as if fully set forth herein.

TECHNICAL FIELD

The present invention relates to a method for forming a silicon oxide nanopattern, a method for forming a metal nanopattern, and a magnetic recording medium for information storage using the same. More particularly, the present invention relates to a method for forming a silicon oxide nanopattern, in which the method can be used to easily form a nanodot or nanohole-type nanopattern, and a metal nanopattern formed by using the same can be properly applied to a next-generation magnetic recording medium for storage information, etc., a method for forming a metal nanopattern, and a magnetic recording medium for information storage.

BACKGROUND

With the rapid progress of nano scientific technology, demands on nano-scaled materials are greatly increasing and the size of an electronic device is more and more decreasing. Thus, studies have been continuously conducted to develop next-generation electronic devices such as a semiconductor device having an ultra micropattern by photolithography, electron beam lithography or EUV (extreme ultraviolet) lithography, dip-pen lithography, nanoimprint lithography, block copolymer lithography, etc.

Among them, block copolymer lithography overcomes the technical limitation of the existing photolithography, for example, a limitation in the pattern size to be formed, and also forms a nanostructure or a nanopattern in an easier and inexpensive manner by self-assembly of block copolymers. Further, the material structure of the block copolymer can be made of a polymer material similar to the photoresist currently used, and thus it can be more easily applied to a current semiconductor manufacturing process.

Further, the block copolymer includes polymer blocks having different chemical structures, connected through a covalent bond, and according to the compositions of the blocks constituting the block copolymer, the length of the chain, and Flory-Huggins parameter, it may form various nanostructures including a complicated three-dimensional structure such as a gyroid or a HPL (hexagonal perforated lamellae) structure, as well as a basic structure such as a sphere, a cylinder, or a lamellae. Also, the nanostructure may be controlled to have various sizes, according to chemical structure of the block copolymer, the compositional ratio of blocks, the molecular weight thereof, etc. The block copolymer lithography has attracted much attention due to applicability of a non-destructive process, simple production of a template for high density arrangement of nano-scale patterns, etc. In particular, among the micro-phases of block copolymer, a block copolymer having a cylindrical structure has a variety of applications including a flash memory, a storage medium, an optical device, an electronic circuit, etc., and thus it is most commonly applied to a block copolymer film or lithography using the same. For such application, it is very important to easily control the orientation and arrangement of the cylindrical nanostructure in a desired shape.

Meanwhile, a silicon oxide nanodot or a metal nanodot has received much attention as a nanopattern type of a material applicable to the fields such as an optical device, an optical waveguide, a chemical sensor, a magnetic storage medium, etc. Therefore, recent studies have been actively conducted to form the nanodot-shaped nanopattern using the cylindrical nanostructure of the block copolymer.

For example, it was suggested that silicon oxide is selectively reacted with a hydrophilic PEO block using a sol-gel precursor (block copolymer) such as poly(styrene-b-ethylene oxide) (PS-b-PEO), and then calcination is performed to remove all of the block copolymers, thereby forming a silicon oxide nanostructure. In the similar way, it was also suggested that a poly(styrene-b-methyl methacrylate) (PS-b-PMMA) thin film oriented perpendicular to a substrate is formed as a template, and PMMA is removed after degraded by UV radiation, and then tetraethoxysilane is introduced into the PMMA-removed pore or tetraethoxysilane is selectively treated to the PMMA block without UV radiation, thereby forming a silicon oxide nanostructure. Additionally, it was also suggested that a thin film such as poly(styrene-b-dimethylsiloxane) (PS-b-PDMS), poly(styrene-b-4-vinyl pyridine) (PS-b-P4VP), etc. is formed and then treated with UV/ozone, or the pores in the thin film are filled with PDMS, etc., and then treated with oxygen plasma, thereby forming a silicon oxide nanodot.

However, the previous experimental results showed a disadvantage in that the nanodot formation process becomes complicated, because use of a sol-gel precursor or an additional PDMS coating process is needed after selectively removing small blocks or segments constituting the cylindrical structure of the block copolymer, in order to form a silicon oxide nanodot. Further, it is difficult to form high aspect ratio nanodots in most block copolymers. When metal nanodots are formed according to the previous experimental results, a complicated subsequent process is also required after formation of nanohole-type patterns. However, a block copolymer or a related technology which can be used for more easily forming nanopatterns such as silicon oxide nanodots, metal nanodots, etc. in a desired shape has not been developed yet.

SUMMARY OF THE INVENTION

The present invention provides a method for forming a silicon oxide nanopattern capable of easily forming a nanodot or nanohole-shaped nanopattern.

Further, the present invention provides a method for forming a metal nanopattern using the silicon oxide nanopattern, etc.

Furthermore, the present invention provides a next-generation magnetic recording medium for information storage using the metal nanopattern, etc.

The present invention provides a method for forming a silicon oxide nanopattern, including the steps of forming a block copolymer thin film including hard segments containing a repeating unit of the following Chemical Formula 1 and soft segments containing a (meth)acrylate-based repeating unit of the following Chemical Formula 2 on silicon oxide of a substrate; selectively removing the soft segments from the block copolymer thin film; and conducting reactive ion etching of silicon oxide using the block copolymer thin film from which the soft segments are removed, as a mask to form a silicon oxide nanodot or nanohole pattern.

[Chemical Formula 1]

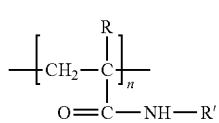

[Chemical Formula 2]

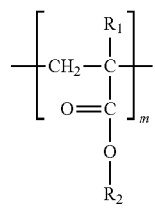

In Chemical Formula 1, n is an integer of 5 to 600, R is hydrogen or methyl, R' is X,

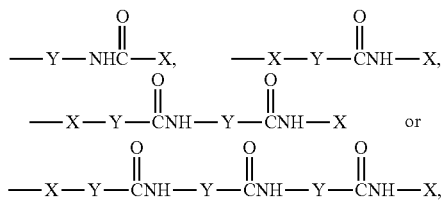

X is —Z—R", Y is alkylene having 1 to 10 carbon atoms, Z is arylene having 6 to 20 carbon atoms, R" is a linear or branched hydrocarbon having 10 to 20 carbon atoms, or a linear or branched perfluorohydrocarbon having 10 to 20 carbon atoms, and in Chemical Formula 2, m is an integer of 30 to 1000, $R_1$ is hydrogen or methyl, and $R_2$ is alkyl having 1 to 20 carbon atoms.

Further, the present invention provides a method for forming a nanodot-shaped metal nanopattern, including the steps of forming a block copolymer thin film including the hard segments containing the repeating unit of Chemical Formula 1 and the soft segments containing the (meth)acrylate-based repeating unit of Chemical Formula 2 on a substrate; selectively removing the soft segments from the block copolymer thin film; and conducting deposition of a metal on the block copolymer thin film from which the soft segments are removed.

Furthermore, the present invention provides a magnetic recording medium for information storage including the metal nanopattern which is formed by the above described method for forming the metal nanopattern.

DETAILED DESCRIPTION OF THE EMBODIMENTS

Hereinafter, a method for forming a silicon oxide or metal nanopattern and a next-generation magnetic recording medium for information storage according to specific embodiments of the present invention will be described in detail.

According to one embodiment of the present invention, provided is a method for forming a silicon oxide nanopattern, including the steps of forming a block copolymer thin film including hard segments containing a repeating unit of the following Chemical Formula 1 and soft segments containing a (meth)acrylate-based repeating unit of the following Chemical Formula 2 on silicon oxide of a substrate; selectively removing the soft segments from the block copolymer thin film; and conducting reactive ion etching of silicon oxide using the block copolymer thin film from which the soft segments are removed, as a mask to form a silicon oxide nanodot or nanohole pattern:

[Chemical Formula 1]

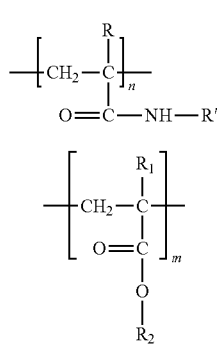

[Chemical Formula 2]

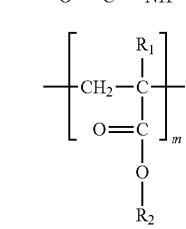

in Chemical Formula 1, n is an integer of 5 to 600, R is hydrogen or methyl, R' is X,

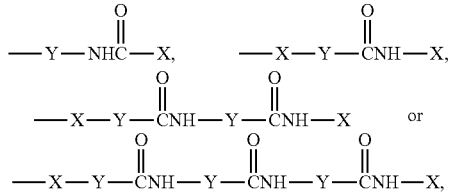

X is —Z—R", Y is alkylene having 1 to 10 carbon atoms, Z is arylene having 6 to 20 carbon atoms, R" is linear or branched hydrocarbon having 10 to 20 carbon atoms, or linear or branched perfluorohydrocarbon having 10 to 20 carbon atoms, and in Chemical Formula 2, m is an integer of 30 to 1000, $R_1$ is hydrogen or methyl, and $R_2$ is alkyl having 1 to 20 carbon atoms.

The present inventors synthesized a novel block copolymer by sequentially polymerizing specific (meth)acrylate-based monomers and acrylamide-based monomers (monomers of Chemical Formulae 3 and 4 described below; the same as below) through RAFT polymerization which is known as a living radical polymerization method, and they demonstrated its characteristics. They had applied it for a patent, provided with Korean Patent Application No. 2012-0027392.

Meanwhile, the results of continuous experiments of the present inventors showed that a silicon oxide nanodot or nanohole-shaped pattern can be very easily formed by block copolymer lithography using this novel block copolymer thin film. In particular, it was confirmed that the silicon oxide nanodot or nanohole-shaped pattern can be very easily formed at a low production cost without use of TEOS (tetraethyl orthosilicate) sol-gel precursor or without a complicated subsequent process such as PDMS coating process in the formation of the nanodot or nanohole pattern.

For example, according to one embodiment of the present invention, a silicon oxide nanodot or nanohole pattern can be formed by a very simplified method of self-arranging the soft segments in cylindrical forms on the hard segments while the block copolymer thin film is formed by solvent annealing or heat treatment, and then selectively removing the soft segments, and etching the lower silicon oxide using the block copolymer thin film, on which the hard segments remain, as a mask.

Therefore, it was confirmed that the method for forming the nanopattern of one embodiment can be properly applied to a nanopatterning process of electronic devices including next-generation semiconductor device, or a fabrication process of nano biosensors, which requires formation of the nanodot or nanohole patterns, etc.

As such, the above described formation of the regular nanodot or nanohole patterns using the block copolymer is likely to be attributed to self-assembling behavior of the acrylamide-based polymer block of Chemical Formula 1 constituting the hard segment and microphase separation from the soft segment. Hereinafter, the technical cause will be explained in more detail.

A polymer block constituting the hard segment (i.e., repeating unit of Chemical Formula 1) may be obtained by polymerization of specific acrylamide-based monomers, to be explained later. The acrylamide-based monomer has a chemical structure that contains a self-assembling non-polar aliphatic hydrocarbon (having more than 10 carbon atoms), an arylene group causing $\pi$-$\pi$ orbital interactions and an amide group causing intermolecular or intramolecular hydrogen bonding. Through the self-assembling behavior of the long-chain aliphatic hydrocarbon, $\pi$-$\pi$ orbital interactions of the arylene groups and intramolecular hydrogen bonding of the amide groups, the monomer may form a regular crystal structure in the solid state.

Thus, if a polymerization of the monomers is conducted, polymerization occurs while the monomer molecules are well-oriented, and therefore the individual monomer molecules are regularly arranged in the polymer chain. More specifically, the monomer molecules well-oriented through the polymerization combine together to form one polymer chain (i.e., one polymer building block), and these polymer building blocks aggregate to form a regularly arranged polymer. Due to the regular arrangement of the polymer building blocks in the polymer, the polymer block of the hard segment (i.e., repeating unit of Chemical Formula 1) may manifest self-assembling property, which defines a plurality of spaces having uniform size, after polymerization.

Meanwhile, the block copolymer is prepared by polymerization of the acrylamide-based monomers after polymer blocks constituting the soft segments are formed by polymerization of the (meth)acrylate-based monomers. Thus, if polymerization of the acrylamide-based monomers is conducted, the plurality of spaces are defined by the hard segments and self-assembling property of the monomer constituting the hard segment, and the polymer blocks of the hard segments are regularly spontaneously arranged at ends of the soft segments, thereby forming the above explained block copolymer. It is likely that the regular arrangement of the hard segment polymer blocks arises from self-assembling behavior of the crystalline hard segment and microphase separation from the amorphous soft segment.

As a result, in the block copolymer and a thin film treated by solvent annealing or heat treatment, a nanostructure or nanopattern may be formed in which on the hard segments containing the repeating unit of Chemical Formula 1, the soft segments containing the repeating unit of Chemical Formula 2 are regularly arranged in cylindrical forms. By controlling the conditions of the solvent annealing or heat treatment, the block copolymer and the thin film thereof may have a nanostructure or a nanopattern in which the cylindrical forms are regularly arranged in a square array, hexagonal array, or the like. The regular nanostructure or nanopatterns may be identified through AFM (atomic force microscopy) or SEM (scanning electron microscopy) analysis of the block copolymer thin film, etc.

Therefore, the silicon oxide nanodot or nanohole pattern can be formed by a very simplified method of selectively removing the soft segments from the block copolymer thin film on which the nanostructure or nanopattern is formed, and then etching the lower silicon oxide using the block copolymer thin film on which the hard segments remain as a mask, without use of TEOS sol-gel precursor or without a complicated subsequent process such as PDMS coating process.

It was also confirmed that according to the method for forming the nanopattern of one embodiment, the nanopattern can be formed by easily controlling a desired pattern shape (nanodot, nanohole or nanohole and nanodot-coexisted pattern) according to the process conditions for removing the soft segment or the kind of treatment material, or adsorption of a material such as metal oxide onto the thin film from which the soft segment is removed, the kind, concentration or treatment time of the material to be adsorbed, or the conditions or the number of times of the reactive ion etching process for patterning silicon oxide, as described in more detail below.

This is a new phenomenon that has not been observed in the known method for forming the nanostructure or nanopattern using the block copolymer thin film, and this is likely to be attributed to unique polymer chain structure and reactivity of the hard segment containing the repeating unit of Chemical Formula 1. That is, after selective removal of the soft segments, the polymer chains of the hard segments that remain in the block copolymer thin film undergo their own unique reactions according to subsequent treatment, etching conditions, etc., for example, to convert the nanohole-shaped pattern into the nanodot-shaped pattern. Accordingly, in the method for forming the nanopattern of one embodiment, the nanohole- or nanodot-shaped nanopatterns can be properly formed on the large area substrate by easily controlling the silicon oxide nanopattern in the desired shape (nanodot, nanohole or nanohole and nanodot-coexisted pattern).

Meanwhile, the above described method for forming the silicon oxide nanopattern according to one embodiment of the present invention will be described in more detail below. First, the block copolymer used in the method of one embodiment will be described in more detail, and then each step of the process of forming the nanopattern using the same will be described.

The block copolymer used in the method of one embodiment includes a hard segment containing a repeating unit of Chemical Formula 1. In the repeating unit of Chemical Formula 1, Z may be any arylene having 6 to 20 carbon atoms, and specific examples thereof may include ortho-phenylene

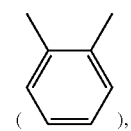

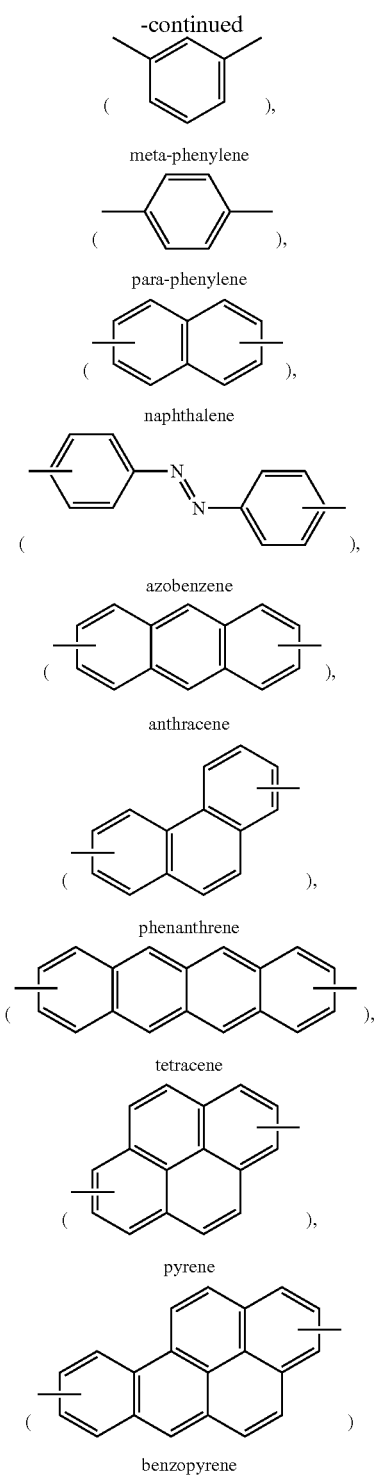

-continued ( [meta-phenylene] ), ( [para-phenylene] ), ( [naphthalene] ), ( [azobenzene] ), ( [anthracene] ), ( [phenanthrene] ), ( [tetracene] ), ( [pyrene] ), ( [benzopyrene] )

or the like.

Further, R" may be a linear or branched aliphatic hydrocarbon substituted at the ortho-, meta- or para-position of the aromatic ring in Z, and the hydrocarbon may have a long chain containing at least 10 carbon atoms, more specifically, 10 to 20 carbon atoms. Also, the hydrocarbon of R" may be substituted with fluorine atom and R" may be a linear or branched perfluorohydrocarbon having 10 to 20 carbon atoms.

As the repeating unit of Chemical Formula 1 and the monomer of the following Chemical Formula 4 have a long chain hydrocarbon and arylene, self-assembling property of the hard segment or the monomers may be remarkably manifested, and as a result, a cylindrical nanostructure or nanopattern may be formed in which the amorphous soft segments are regularly arranged in a square or hexagonal shape on the crystalline hard segments by micro-phase separation.

The hard segment may include only one kind of the repeating unit belonging to Chemical Formula 1, or it may include a copolymer-type repeating unit by including two or more kinds of the repeating unit belonging to Chemical Formula 1.

Further, the block copolymer used in the method of one embodiment includes a soft segment together with the above described hard segment, and the soft segment may include a (meth)acrylate-based repeating unit of Chemical Formula 2. The (meth)acrylate-based repeating unit may be derived from a common acrylate-based or methacrylate-based monomers, for example, methyl acrylate (MA), methyl methacrylate (MMA), ethyl acrylate (EA), ethyl methacrylate (EMA), n-butyl acrylate (BA), n-octyl acrylate (BA), or the like. The soft segment may include only one kind of a repeating unit derived from a single acrylate-based or methacrylate-based monomer, or it may include a copolymer repeating unit derived from two or more kinds of acrylate-based or methacrylate-based monomers, i.e., two or more kinds of repeating units.

Furthermore, the block copolymer may have a number average molecular weight of about 5000 to 200000, or about 10000 to 100000. Further, the soft segment included in the block copolymer may have a number average molecular weight of about 3000 to 100000, or about 5000 to 50000.

Also, the block copolymer may include about 40 to 90 wt %, or about 50 to 80 wt %, or 60 to 75 wt % of the hard segments, and about 60 to 10 wt %, or about 50 to 20 wt %, or 40 to 25 wt % of the soft segments.

As the block copolymer satisfies the above molecular weight characteristic and the content range of each segment, a block copolymer thin film including a regular nanostructure or nanopattern may be formed by treating the block copolymer by solvent annealing or heat treatment. Further, a silicon oxide nanodot or nanohole pattern can be effectively formed by using the thin film as a mask. The shape, size or spacing (pitch) of the finally formed silicon oxide nanopattern can be easily controlled by controlling the molecular weight of the block copolymer and/or content range of the segment.

Further, the hard segment and the block copolymer including the same may have a melting point ($T_m$) of about 200 to 300° C. or about 220 to 280° C. Further, the soft segment may have a glass transition temperature ($T_g$) of about 40 to 130° C. or about 95 to 120° C. As the hard segment and the soft segment have the melting point and the glass transition temperature within the above range, a block copolymer thin film including a regular nanostructure or nanopattern may be more preferably formed.

Meanwhile, the above described block copolymer may be prepared by a preparation method including the steps of conducting RAFT polymerization of a reactant containing one or more of the (meth)acrylate-based monomer of Chemical Formula 3, in the presence of a radical initiator and a RAFT reagent; and conducting RAFT polymerization of a reactant containing one or more of the monomer of Chemical Formula 4, in the presence of the resulting polymerization product:

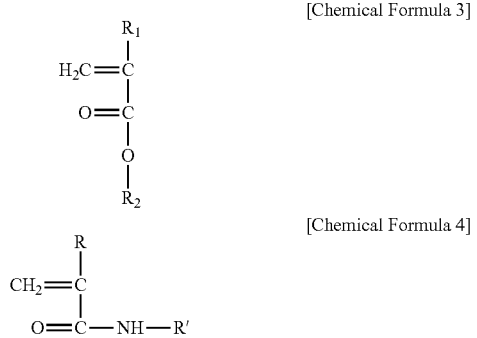

[Chemical Formula 3]

[Chemical Formula 4]

In Chemical Formulae 3 and 4, $R_1$, $R_2$, R and R' are the same as defined in Chemical Formulae 1 and 2.

As described, the block copolymer used in the method of one embodiment may be easily prepared by conducting RAFT polymerization of the (meth)acrylate-based monomers of Chemical Formula 3 to form polymer blocks constituting the soft segments, and conducting RAFT polymerization of the acrylamide-based monomers of Chemical Formula 4 in the presence of the above formed polymer blocks to form polymer blocks constituting the hard segments. That is, if the first RAFT polymerization is conducted, the monomers of Chemical Formula 3 are polymerized to prepare a polymer including a RAFT reagent bound to both ends thereof. Subsequently, if RAFT polymerization of the monomers of Chemical Formula 4 is conducted using the above polymer as a macroinitiator, the monomers of Chemical Formula 4 are polymerized and bound to the end of the macroinitiator, and as the result, the above described block copolymer including the hard segment and the soft segment may be prepared.

As described above, the block copolymer and the thin film including the same may exhibit a property that the other soft segments are regularly arranged in cylindrical forms on the hard segments due to the self-assembling property of the hard segment formed by polymerization of the monomers of Chemical Formula 4. Therefore, the block copolymer thin film, in which the cylindrical forms are regularly arranged in a square or hexagonal shape, may be manufactured using the block copolymer, and the thin film can be used to form the silicon oxide nanodot or nanohole pattern according to the method for forming the nanopattern of one embodiment.

Each step of the above described preparation method of the block copolymer will be described in more detail.

First, in the preparation method, as the monomer of Chemical Formula 3, any widely known (meth)acrylate-based monomer may be used, and specific examples thereof may include methyl acrylate (MA), methyl methacrylate (MMA), ethyl acrylate (EA), ethyl methacrylate (EMA), n-butyl acrylate (BA), n-octyl acrylate (BA), or the like, and two or more kinds of the monomers selected therefrom may be also used.

As the monomer of Chemical Formula 4, any monomer satisfying the structure of Chemical Formula 4 may be used, specific examples thereof may include N-(para-dodecyl)phenyl acrylamide (DOPAM), N-(para-tetradecyl)phenyl acrylamide (TEPAM), N-(para-hexadecyl)phenyl acrylamide (HEPAM), N-(para-dodecyl)naphthyl acrylamide (DONAM), N-(para-tetradecyl)naphthyl acrylamide (TENAM), N-(para-hexadecyl)naphthyl acrylamide (HENAM), N-(para-dodecyl)azobenzenyl acrylamide (DOAZAM), N-(para-tetradecyl)azobenzenyl acrylamide (TEAZAM), N-(para-hexadecyl)azobenzenyl acrylamide (HEAZAM), N-[4-(3-(5-(4-dodecyl-phenylcarbamoyl)pentyl-carbamoyl)-propyl)phenyl acrylamide (DOPPPAM), or the like, and two or more monomers selected therefrom may be used.

As these monomers, those described in Korean Patent Application No. 2011-0087290 (Korean Patent No. 1163659) of the present inventors may be used. As the hard segment and soft segment are formed by using these monomers, the monomer molecules may be more regularly arranged, and thus well-oriented monomer molecules may be linked to each other to form polymer chains. As a result, more regular spaces may be defined in the hard segments prepared from the monomers of Chemical Formula 4, and the soft segments may be regularly arranged in the spaces, and therefore, a block copolymer having a more excellent and regular nanostructure and nanopattern, and a thin film thereof may be manufactured.

The monomer of Chemical Formula 4 and the preparation method thereof are described in Korean Patent Application No. 2011-0087290 (Korean Patent No. 1163659) of the present inventors, which are apparent to those skilled in the art. Therefore, detailed descriptions thereof will be omitted.

Meanwhile, in the preparation method of the block copolymer, first, RAFT polymerization of a reactant containing one or more of the (meth)acrylate-based monomer of Chemical Formula 3 is conducted in the presence of a radical initiator and a RAFT reagent, before polymerization of the monomers of Chemical Formula 4. As a result, a kind of a macroinitiator may be obtained, in which the RAFT reagent is bound to both ends of the (meth)acrylate-based polymer polymerized from the monomers of Chemical Formula 3.

At this time, the radical initiator, RAFT reagent and monomers of Chemical Formula 3 may be prepared as a reaction solution dissolved in an organic solvent, and the RAFT polymerization process may be conducted in the reaction solution state. At this time, the organic solvent may include one or more halogen-based or aromatic solvents selected from the group consisting of methylenechloride, 1,2-dichloroethane, chlorobenzene, dichlorobenzene, benzene and toluene, or one or two or more kinds of a polar solvent selected from the group consisting of acetone, chloroform, tetrahydrofurane (THF), dioxane, monoglyme, diglyme, dimethylformamide (DMF), dimethylsulfoxide (DMSO), and dimethylacetamide (DMAC). The organic solvent may be used in an amount of about 2 to 10 times of the weight of the monomers of Chemical Formula 3. The organic solvent may be also used as a reaction medium in the RAFT polymerization of the monomers of Chemical Formula 4, to be described later.

As the radical initiator, any initiators known to be usable in radical polymerization may be used without specific limitations. Specific examples thereof may include azobisisobutyronitrile (AIBN), 2,2'-azobis-(2,4-dimethylvaleronitrile, benzoyl peroxide (BPO), di-t-butyl peroxide (DTBP), or the like, and two or more kinds thereof may be used. The radical initiator may also be used in the RAFT polymerization of the monomers of Chemical Formula 4, to be described later.

The RAFT reagent may include a thermal decomposition initiator such as S-1-dodecyl-S'-($\alpha,\alpha'$-dimethyl-$\alpha''$-acetic acid)trithiocarbonate, cyanoisopropyl dithiobenzoate, cumyl thiobenzoate, cumyl phenylthioacetate, 1-phenylethyl-1-phenyldithioacetate, or 4-cyano-4-(thiobenzoylthio)-N-succinimide valerate, and a mixture of two or more kinds thereof may be used.

The RAFT reagent may be used in the ratio of about 0.001 to 5.0 mol % of the weight of the monomers of Chemical Formula 3, and the radical initiator may be used in the mole equivalent of about 0.1 to 1.0 of the RAFT reagent. Using the radical initiator and RAFT reagent in the above contents, RAFT polymerization may be effectively conducted.

If the above described RAFT polymerization is conducted, a kind of a macroinitiator may be obtained, in which the RAFT reagent is bound to both ends of the (metha)acrylate-based polymer polymerized from the monomers of Chemical Formula 3. The macroinitiator may have a molecular weight corresponding to the molecular weight of the soft segments of the finally prepared block copolymer, and it may have a number average molecular weight of about 3000 to 100000, or about 5000 to 50000.

Meanwhile, after the RAFT polymerization of Chemical Formula 3, RAFT polymerization of the monomers of Chemical Formula 4 is conducted in the presence of the resulting polymerization product, namely, the above macroinitiator, and a radical initiator. The RAFT polymerization may be conducted using the same kinds and amounts of the radical initiator and organic solvent as used in the first RAFT polymerization, except that the above described macroinitiator is used instead of the RAFT reagent. For example, after the RAFT polymerization of Chemical Formula 3, the macroinitiator, the radical initiator, the monomer of Chemical Formula 4, and the organic solvent may be mixed homogeneously to form a solution, and oxygen present in the solution may be removed under nitrogen atmosphere, and then RAFT polymerization of the monomers of Chemical Formula 4 may be conducted.

In the above described preparation method, each RAFT polymerization process of the monomers of Chemical Formulae 3 and 4 may be conducted at a reaction temperature of about 30 to 140° C., or 60 to 130° C. for about 30 to 200 hours, or about 50 to 170 hours.

After conducting the RAFT polymerization of the monomers of Chemical Formula 4, a step of precipitating the resulting polymerization product in a non-solvent may be further conducted. As a result, the above described block copolymer may be obtained with high purity. As the non-solvent, any solvent that does not dissolve the above described polymerization product (for example, polymer corresponding to each segment and block copolymer) may be used. Specific examples of the non-solvent may include a polar solvent such as methanol, ethanol, normal propanol, isopropanol, or ethylene glycol, or a non-polar solvent such as petroleum ether, and a mixed solvent of two or more kinds thereof may be also used.

Meanwhile, each step of a method for forming the nanopattern of one embodiment using the above described block copolymer will be described.

In the formation method of one embodiment, the above described block copolymer thin film is first formed on silicon oxide of the substrate. At this time, silicon oxide may be formed on a substrate such as silicon substrate or wafer by a typical method such as deposition or thermal oxidation of the substrate, etc.

Further, to form the block copolymer thin film, the block copolymer is first dissolved in an organic solvent, and then applied onto the substrate. At this time, the block copolymer may have a number average molecular weight of about 5000 to 200000, and include about 40 to 90 wt % of the hard segments and about 60 to 10 wt % of the soft segments, as described above.

As the block copolymer satisfies the above molecular weight and the content range of each segment, a block copolymer thin film including a regular nanostructure or nanopattern can be preferably formed by solvent annealing or heat treatment of the block copolymer. Further, the shape, size or spacing of the finally formed nanopattern can be properly controlled by controlling the molecular weight of the block copolymer or the content range of each segment.

As the organic solvent to dissolve the block copolymer, one or more kinds of solvents selected from non-polar or polar solvents such as n-hexane, n-heptane, n-octane, cyclohexane, methylenechloride, 1,2-dichloroethane, chloroform, ethylether, benzene, chlorobenzene, dichlorobenzene, toluene, THF, acetone, dioxane, ethylacetate, DMF, DMAC, or DMSO may be used. The amount of the organic solvent may be about 10 time or more of the weight of the block copolymer.

To apply the organic solution of the block copolymer at a uniform thickness, a spin coater may be used to spin-coat the organic solution on a substrate, etc. thereby forming a thin film. At this time, the rotation number and time of the spin coater are important as well as the kind and concentration of the solvent, and considering this, the rotation number and time may be controlled to about 2000-4000 rpm and about 20-60 seconds, respectively.

Meanwhile, after applying the block copolymer solution, a step of conducting orientation of each segment of the block copolymer by solvent-annealing or heat-treatment of the thin film may be conducted.

For solvent annealing, the same organic solvent as used for dissolving the block copolymer may be used, but a mixed solvent of two or more kinds respectively selected from a non-polar solvent and a polar solvent may be preferably used. Further, the solvent annealing may be conducted at room temperature for about 4 to 96 hours. As the solvent annealing step is conducted under the above described conditions, a cylindrical nanostructure or nanopattern including the soft segments which are more regularly arranged can be formed on the block copolymer thin film.

According to the molecular weight of the block copolymer, each segment of the block copolymer may be oriented by heat-treatment of the thin film. At this time, the heat treatment may be conducted at a temperate higher than a melting point ($T_m$) of the repeating unit of Chemical Formula 1 constituting the hard segment and a glass transition temperature ($T_g$) of the repeating unit of Chemical Formula 2 constituting the soft segment. By this method, a regular cylindrical nanostructure or nanopattern may be formed on the thin film.

Furthermore, by controlling the conditions of the solvent annealing or heat treatment, the arrangement form of the cylindrical nanopattern may be controlled to various shapes such as a square shape, a hexagonal shape, etc., or the size of each pattern or the spacing between patterns can be controlled. To uniformly arrange the nanopatterns in a desired shape, size or spacing, the molecular weight of the block copolymer or the chemical structure or compositional ratio of each segment may be appropriately controlled.

After forming the block copolymer thin film by the above described method, a step of adsorbing a material onto the thin film in which the material may be selectively adsorbed onto the hard segment can be conducted. The material that can be adsorbed onto the hard segment may be metal oxide, for example, an oxide of a transition metal such as Ru or Os. In a specific embodiment, the adsorption step of the material may be conducted by a method of treating the block copolymer thin film with a metal oxide solution (e.g., $RuO_4$ or $OsO_4$ solution) of about 0.05 to 1.0 wt %, or about 0.1 to 0.8 wt %, or about 0.1 to 0.6 wt %.

The shape of the nanopattern may be determined, depending on the polymer chain of the hard segments that remain after removal of the soft segments, and the reaction conditions to induce chemical reactions (e.g., acid treatment condition or etching condition described below, etc.) as well as the conditions such as the kind, treatment concentration or treatment time of the material adsorbed onto the hard segment. Therefore, by controlling the treatment conditions of the material, the reaction conditions, etc., it is possible to control the final silicon oxide nanopattern (nanodot, nanohole or nanostructure where both of them exist together) and also to easily control the size or spacing of the nanopatterns.

After forming the block copolymer thin film including the nanopattern by the above described method, the step of selectively removing the soft segments from the thin film is conducted. To selectively remove the soft segments, UV may be irradiated to the block copolymer thin film. By UV irradiation, the soft segments are selectively decomposed, and subsequently, the UV-decomposed soft segments may be selectively removed by acid treatment of the block copolymer thin film.

At this time, for example, UV of about 254 nm wavelength may be irradiated at about 5 to 50 Joule per unit area ($cm^2$) for about 1 minute to 60 minutes, and subsequently, the block copolymer thin film is treated with an acid to remove the UV-decomposed soft segments. As the acid, an aqueous solution of hydrochloric acid, acetic acid, trifluoroacetic acid, etc. may be used, and other various acids or aqueous solutions thereof may be used. However, in more specific example, a 99.5% acetic acid or trifluoroacetic acid aqueous solution may be used, or a 3.5 to 11.8 M hydrochloric acid aqueous solution, etc. may be used. The block copolymer thin film is treated with about 1 to 20 mL, or about 2 to 10 mL of the acid aqueous solution for about 1 minute to 1 hour so as to favorably remove the decomposed soft segments.

After the acid treatment step, a step of washing the block copolymer thin film with deionized water may be further conducted.

As the UV irradiation process and the optional acid treatment process, and the washing process are conducted under the above described conditions, the soft segments are selectively removed from the block copolymer thin film to remain the hard segments, and therefore, the block copolymer thin film including a nanostructure or nanopattern may be formed.

In particular, the shape, size or spacing of the nanopatterns formed on the block copolymer thin film can be controlled and/or partially modified by controlling the kind or concentration of the acid treated to the thin film, UV treatment conditions, or the washing time after acid treatment. As described above, this phenomenon is likely to be attributed to polymer chain structure and chemical reactivity of the hard segment of the block copolymer, in which these polymer chains cause a chemical reaction according to the specific conditions of soft segment-removing process. As a result, the shape, size, or spacing of the silicon oxide nanopatterns finally formed in one embodiment can be more easily controlled.

Meanwhile, after selectively removing the soft segments by the above described process, only the hard segments remain on the block copolymer thin film, and therefore, silicon oxide can be exposed on the substrate in the part where the nanopatterns have been formed in a cylindrical form. Therefore, if reactive ion etching is conducted on silicon oxide using the block copolymer thin film as a mask, silicon oxide may be selectively etched and removed only in the exposed parts, thus patterned in a desired shape, for example, a nanodot or nanohole-shaped pattern.

The reactive ion etching step may be conducted, for example, under conditions of about 40~60/20~40 sccm and about 60~100 Watt for 1-10 minutes using $CF_4$/Ar gas ion, etc.

After the reactive ion etching step, a step of removing the block copolymer thin film by oxygen plasma treatment may be further conducted, so that the block copolymer thin film (e.g., hard segment) remaining on the patterned silicon oxide may be removed. The oxygen plasma treatment may be conducted under conditions of, for example, about 2060 sccm and about 20~100 W, for about 1-10 minutes, and as a result, a silicon oxide nanodot or nanohole pattern can be formed.

The shape, size, or spacing of the silicon oxide nanopatterns finally formed in one embodiment can be also easily controlled, depending on the conditions or the number of times of the reactive ion etching or oxygen plasma treatment process. For example, by controlling the conditions of the reactive ion etching or oxygen plasma treatment, the finally formed nanopattern shape can be converted from the nanohole pattern to the nanodot pattern or the nanohole and nanodot-coexisted pattern.

For example, the silicon oxide nanopattern formed by the above described method of one embodiment may be a nanodot pattern in which silicon oxide nanodots having a diameter of about 5 to 60 nm are formed at a spacing of about 10 to 100 nm, or a nanohole pattern in which silicon oxide nanoholes having a diameter of about 5 to 60 nm are formed at a spacing of about 10 to 100 nm, and it may be also a nanopattern in which both of these nanodots and nanoholes are formed together.

As used herein, the term "diameter" of the nanodot or nanohole means the longest distance among the straight lines between any two points on the circumference of one nanodot or nanohole, and the term "spacing (or pitch)" means the shortest distance among the distances between contiguous nanodots or nanoholes.

As supported by Examples below, it was confirmed that in the formation method of one embodiment, the nanohole pattern can be converted to a nanodot-shaped pattern, or a nanodot and nanohole-coexisted pattern by reducing the acid treatment time for removal of soft segments, or by reducing the acid treatment amount or concentration. Further, the shape, size (diameter), or spacing of the nanopattern can be also controlled within the above range by converting the kind of the acid treated in the above process from acetic acid to hydrochloric acid, or by increasing the concentration of the material adsorbed onto the block copolymer thin film, or by controlling the molecular weight of the block copolymer. Further, the shape or aspect ratio of the silicon oxide nanopattern can be controlled by changing the conditions or the number of times of the reactive ion etching or oxygen plasma treatment.

For example, the silicon oxide nanodot or nanohole pattern formed according to one embodiment may be a nanopattern in which the nanodot or nanoholes having a relatively low aspect ratio and being adjacent to each other are partially connected to each other, or it may be a nanopattern including silicon oxide nanodots or silicon oxide nanoholes having a high aspect ratio of about 1.1 or more, or about 1.2 or more, or about 1.4 or more. The shape and size of the nanopattern can be easily controlled by controlling the above described process conditions, etc.

Therefore, the nanodot or nanohole-shaped nanopattern varying in the shape, size and spacing which is formed by the method of one embodiment can be properly applied to a variety of optical devices, optical waveguides, chemical sensors, electronic devices, magnetic storage media, etc.

Meanwhile, according to another embodiment of the present invention, provided is a method for forming a nanodot-shaped metal nanopattern using the above described block copolymer. The method for forming the metal nanopattern may include the steps of forming a block copolymer thin film including the hard segments containing the repeating unit of Chemical Formula 1 and the soft segments containing the (meth)acrylate-based repeating unit of Chemical Formula 2 on a substrate; selectively removing the soft segments from the block copolymer thin film; and conducting deposition of a metal on the block copolymer thin film from which the soft segments are removed.

At this time, the method of another embodiment may further include a step of forming silicon oxide between the substrate and the block copolymer thin film, and in this case, the method may further include a step of conducting reactive ion etching of silicon oxide to form a silicon oxide nanodot or nanohole pattern using the block copolymer thin film from which the soft segments are removed as a mask, before the metal deposition. That is, in method of another embodiment, the block copolymer nanopattern may be formed and then used to directly form a metal nanopattern. Alternatively, the silicon oxide nanohole pattern may be formed and then used to form the metal nanopattern according to one embodiment of the present invention.

FIGS. 6 to 8 are schematic diagrams showing three examples of the method for forming the nanodot-shaped metal nanopattern according to another embodiment of the present invention. First, FIG. 6a is a schematic diagram showing the method for forming the metal nanopattern according to one example of the present invention, and FIG. 6b is a schematic diagram showing a top-down view of the nanodot-shaped metal nanopattern formed according to the method of FIG. 6a.

According to the method of one example, a block copolymer thin film having a cylindrical nanopattern or nanostructure is first formed in the same method as in one embodiment, and then soft segments can be selectively removed from the thin film by UV irradiation. As a result, a block copolymer thin film pattern (BCP patterns) is formed, as shown in FIG. 6a. At this time, the block copolymer thin film pattern may be used as it is. Alternatively, it is also possible that a silicon oxide nanohole pattern is formed by using the same according to the method of one embodiment, and then used to form the metal nanopattern.

If a metal is deposited on the substrate on which the thin film pattern or nanohole pattern is formed, a nanodot-shaped metal nanopattern can be formed, as shown in a lower figure of FIG. 6a and FIG. 6b.

In the method of one example, each step before the metal deposition step may be conducted in accordance with the method for forming the silicon oxide nanopattern of one embodiment, and the metal deposition step may be conducted in accordance with the general metal deposition process, and therefore, a detailed description of each step of the process will be omitted.

However, in the metal deposition step, the metal may be a magnetic metal, for example, selected from the group consisting of cobalt, chrome, platinum, nickel and iron, or a magnetic metal alloy containing two or more selected therefrom. Further, the metal may be deposited at a thickness of about 10 to 50 nm by a method such as electron beam evaporation, vacuum sputtering, vacuum deposition, etc.

If the metal is deposited on the entire area of the substrate on which the thin film patterns (BCP patterns) or nanohole patterns are formed, by the above described method, a metal nanodot patterns as illustrated in the lower figure of FIG. 6a and FIG. 6b may be formed, and if this metal nanodot pattern includes the above described magnetic metal, it can be very preferably applied to the next-generation magnetic recording medium for information storage, etc. According to the kind of the metal, the method for forming the metal nanopattern may be also applied to the fabrication of a variety of electronic devices such as memory semiconductor, solar cell, display, sensor, etc.

In the above described method for forming the metal nanopattern, if necessary, a step of lifting off the metal-deposited block copolymer thin film may be further conducted after the metal deposition step according to the method of another example illustrated in FIG. 7a. As a result, the metal nanopattern shown in the lowest figure of FIG. 7a and FIG. 7b may be formed, and this metal nanopattern can be also applied to the fabrication of a variety of electronic devices such as next-generation magnetic recording medium, memory semiconductor, solar cell, display, sensor, etc.

Meanwhile, still another example of the method for forming the metal nanopattern is schematically illustrated in FIG. 8. In the above described method of FIGS. 6 and 7, the metal may be deposited at a thickness lower than that of the block copolymer thin film that remains after removal of the soft segments, in the metal deposition step. In contrast, in the method of still another example as illustrated in FIG. 8, after formation of the block copolymer thin film patterns or silicon oxide nanohole patterns, the metal may be deposited at a higher thickness so that the thin film patterns or nanohole patterns are embedded therein. For example, the metal may be deposited at a thickness of about 30 to 70 nm by a method such as electron beam evaporation, vacuum sputtering, vacuum evaporation, etc. After the metal deposition step, a step of selectively removing the metal on the thin film patterns or nanohole patterns, and the block copolymer thin film by vacuum plasma etching, etc. may be further conducted.

When the etching process is conducted, the metals on the block copolymer thin film constituting the skeleton of the block copolymer thin film patterns or nanohole patterns may be etched and removed from the all over the surface. Once all the metals on the thin film patterns or block copolymer thin film are removed to expose the thin film patterns or block copolymer thin film, the block copolymer thin film, etc. may be selectively removed. This is because that the block copolymer thin film, etc. can be etched and removed at a rate several times to several ten times higher than the metal.

As a result, as illustrated in FIG. 8, the nanodot-shaped metal nanopatterns may be formed, and this metal nanopatterns can be also applied to the fabrication of a variety of electronic devices such as next-generation magnetic recording medium, memory semiconductor, solar cell, display, sensor, etc.

Meanwhile, according to still another embodiment, provided is a magnetic recording medium for information storage, including the metal nanopattern formed by the above described method.

Recently, it is known that fabrication of next-generation high integration, high density (e.g., terabit) magnetic recording medium for information storage, etc. requires formation of nanodot-shaped magnetic metal nanopatterns. The known thin film magnetic recording medium has a limitation of information storage density of about 500 gigabit per unit square inch, and patterned media storing information in a high density ferromagnetic nanodot structure is under development as next-generation technology, with the goal of achieving information storage density of 1 terabit per unit square inch. To be applied to the next-generation magnetic recording medium, the nanodot pattern of the magnetic metal is needed to include nanodots having a center distance of about 30 nm or less and a diameter of about 15 nm or less. However, there is a physical limitation in formation of the metal nanodot pattern having such small size by the known photolithography. Also, electron beam lithography capable of forming ultrahigh density nanopatterns was considered. However, electron beam lithography is unsuitable for use in mass production, and thus it cannot be applied to commercialization. Further, if the previously known block copolymer lithography is used, there are limitations in that an additional process for vertical orientation is required or arrangement of the block copolymer patterns is not sufficient, etc., or the metal nanodot patterns should be formed through a very complicated subsequent process after formation of the block copolymer nanohole patterns. That is, there have been barriers in commercialization of the next-generation magnetic recording medium.

However, in the method for forming the metal nanopattern of another embodiment, unique block copolymers are used, and thus high density nanohole patterns can be formed at a very low defect density, and magnetic metal nanodot patterns having very fine size and spacing can be easily formed without a complicated subsequent process. Therefore, the magnetic metal patterns obtained according to another embodiment can be applied to fabrication of the next-generation of magnetic recording medium for information storage, and greatly contribute to commercialization of the next-generation magnetic recording medium.

Moreover, as fully revealed in the above described method for forming the nanopattern of one embodiment, when the unique block copolymer including the repeating unit of Chemical Formula 1 is used, the shape, size and spacing of nanodot patterns can be very easily controlled, and nanodot patterns having a higher aspect ratio can be easily formed. For example, even though a metal nanopattern is formed according to the method shown in FIG. 6, the block copolymer thin film patterns have a high enough height and aspect ratio. Thus, although a metal is deposited at a relatively high thickness, a short circuit or a connection between the metal on the thin film pattern and the metal between thin film patterns can be effectively prevented. Therefore, the magnetic metal nanopattern formed by the method of another embodiment can be very properly applied to fabrication of a variety of next-generation magnetic recording media.

Meanwhile, the magnetic recording medium according to still another embodiment can be produced in accordance with the typical constitution, except for including the metal nanopatterns formed by another embodiment, and therefore, a detailed description thereof will be omitted.

Advantageous Effects

According to the present invention, as described above, silicon oxide nanodot or nanohole patterns can be easily formed without use of TEOS sol-gel precursor or without a complicated subsequent process such as PDMS coating process. Further, according to the present invention, nanodot-shaped metal nanopatterns can be also easily formed without a complicated subsequent process.

In the present invention, particularly, the nanopatterns can be formed by very easily controlling the shape, size or spacing of the silicon oxide or metal nanodot- or nanohole-shaped patterns within a desired range.

Therefore, the method for forming the nanopattern of the present invention can be properly applied to a nanopatterning process of electronic devices including next-generation semiconductor device, or a fabrication process of nano biosensors, and the method for forming the metal nanopattern is applied to fabrication of next-generation magnetic recording media for information storage, etc., thereby greatly contributing to commercialization thereof.

BRIEF DESCRIPTION OF DRAWINGS

FIG. 2b is an SEM photograph after formation of silicon oxide nanodot patterns on the bottom of the block copolymer thin film by reactive ion etching and oxygen plasma treatment, after selective removal of soft segments in FIG. 2a;

FIG. 5b is an SEM photograph after formation of silicon oxide nanodot patterns by reactive ion etching and oxygen plasma treatment of the lower silicon oxide, after UV irradiation of the block copolymer thin film of FIG. 5a;

FIG. 6b is a schematic diagram showing a top-down view of the nanodot-shaped metal nanopatterns formed according to the method of FIG. 6a;

FIG. 7b is a schematic diagram showing a top-down view of the nanodot-shaped metal nanopatterns formed according to the method of FIG. 7a;

EXAMPLES

Figure 1A:
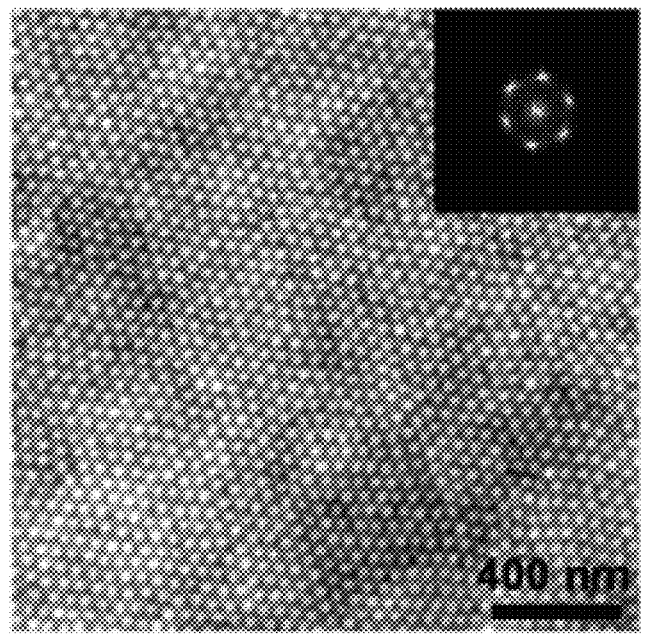
FIG. 1a is an AFM photograph of a nanostructure after formation of a block copolymer thin film by solvent annealing in Example 5.

Hereinafter, the function and effect of the present invention will be described in more detail with reference to the specific Examples of the present invention. However, these Examples are only to illustrate the invention and are not intended to limit the scope of the invention.

Examples 1 to 4

Preparation of Macroinitiator and Block Copolymer

Example 1

Preparation of Macroinitiator (Macro-PMMA)-1

6.0 g of monomers MMA, 66.3 mg of a RAFT reagent cyanoisopropyldithiobenzoate, 24.6 mg of a radical initiator AIBN, and 6.82 mL of benzene were poured into a 20 mL-glass ampoule, and oxygen was removed from the solution by freeze-thawing, and then the ampoule was sealed, and RAFT polymerization was conducted in an oil container of 60° C. for 24 hours. After polymerization, the reaction solution was precipitated in 200 mL of an extraction solvent methanol, filtered under reduced pressure, and dried to prepare a pink macroinitiator (Macro-PMMA)-1 in which the RAFT reagent is bound to both ends of MMA (PMMA) polymer. The polymerization conversion, number average molecular weight ($M_n$), molecular weight distribution ($M_w/M_n$) and glass transition temperature ($T_g$) were 95%, 19400, 1.11 and 119° C., respectively.

Example 2

Preparation of Novel Block Copolymer-1

0.976 g of the acrylamide-based monomer DOPAM synthesized in Example 1 of Korean Patent NO. 1163659, 0.3 g of the macroinitiator-1 prepared in Example 1, 1.70 mg of AIBN, and 5.51 mL of benzene were poured into a 10 mL Schlenk flask, stirred at room temperature for 30 minutes under nitrogen atmosphere, and then RAFT polymerization was conducted at a silicon oil container of 70° C. for 72 hours. The polymer solution was precipitated in 200 mL of methanol, and then dried to prepare a novel light yellow block copolymer-1. The composition ratio of the hard segment vs. the soft segment in the block copolymer-1 (ratio of number average molecular weight measured by GPC) was 65 wt % vs. 35 wt %. The polymerization conversion, number average molecular weight, molecular weight distribution, $T_g$ and melting temperature ($T_m$) were 56%, 54900, 1.30, 119° C., 236° C., respectively.

Example 3

Preparation of Macroinitiator (Macro-PMMA)-2

A pink macroinitiator (Macro-PMMA)-2 was prepared in the same manner as in Example 1, except that 4.085 g of the monomer MMA, 90.3 mg of a RAFT reagent cyanoisopropyldithiobenzoate, 33.5 mg of a radical initiator AIBN, and 4.684 mL of benzene were used. The polymerization conversion, number average molecular weight ($M_n$), molecular weight distribution ($M_w/M_n$) and glass transition temperature ($T_g$) were 90%, 11000, 1.11 and 119° C., respectively.

Example 4

Preparation of Novel Block Copolymer-2

A novel light yellow block copolymer-2 was prepared in the same manner as in Example 2, except that 0.774 g of the acrylamide-based monomer DOPAM synthesized in Example 1 of Korean Patent NO. 1163659, 0.3 g of the macroinitiator-2 prepared in Example 3, 3.0 mg of AIBN, and 4.011 mL of benzene were used. The composition ratio of the hard segment vs. the soft segment in the block copolymer-2 (ratio of number average molecular weight measured by GPC) was 66 wt % vs. 34 wt %. The polymerization conversion, number average molecular weight, molecular weight distribution, $T_g$ and $T_m$ were 66%, 32400, 1.30, 119° C., 235° C., respectively.

Examples 5 to 9

Formation and Identification of Silicon Oxide Nanopattern

Example 5

Formation of Silicon Oxide Nanohole Pattern Using Block Copolymer-1

The block copolymer-1 prepared in Example 2 was dissolved in a chloroform solvent to prepare a 1.0 wt % solution thereof, which was then coated on a substrate of a silicon wafer, in which silicon oxide was formed on the surface thereof, at 3000 rpm for 60 seconds using a spin coater to form a block copolymer thin film. The thin film was put in a desiccator that was maintained under atmosphere of the steam of a mixed solvent of THF/cyclohexane 8/2 (v/v, volume ratio), and aged for 24 hours to manifest a nanostructure on the surface of the thin film.

The thin film having the nanostructure was put in a vial containing 0.1 wt % $RuO_4$ liquid for 2 minutes to adsorb $RuO_4$ on the thin film, and then irradiated with UV at 254 nm for 20 minutes. The film was put in 2.5 mL of 99.5% acetic acid solution for 20 minutes, and then taken out and washed with deionized water several times and dried to manufacture a nanopatterned thin film in which soft segments of the block copolymer-1 selectively were removed. This film was used as a mask to conduct RIE (Reactive ion etching; reactive ion etching) process under predetermined conditions ($CF_4$/Ar=60/20 sccm; 80 W; 120 seconds), and then silicon oxide nanohole patterns were finally formed by oxygen plasma treatment (40 sccm; 50 W; 60 seconds).

Figure 1B:
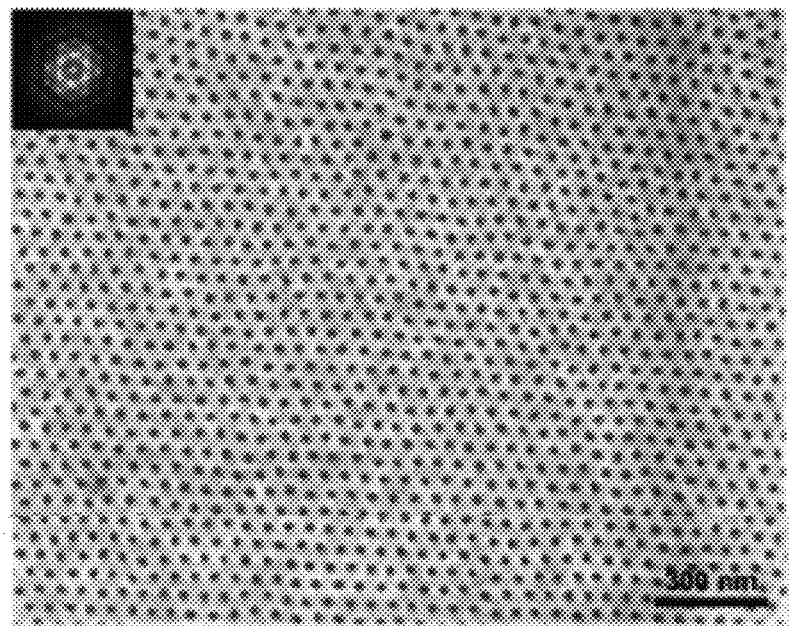
FIG. 1b is an SEM photograph after selective removal of soft segments from the block copolymer thin film of FIG. 1a by UV irradiation.
Figure 1C:
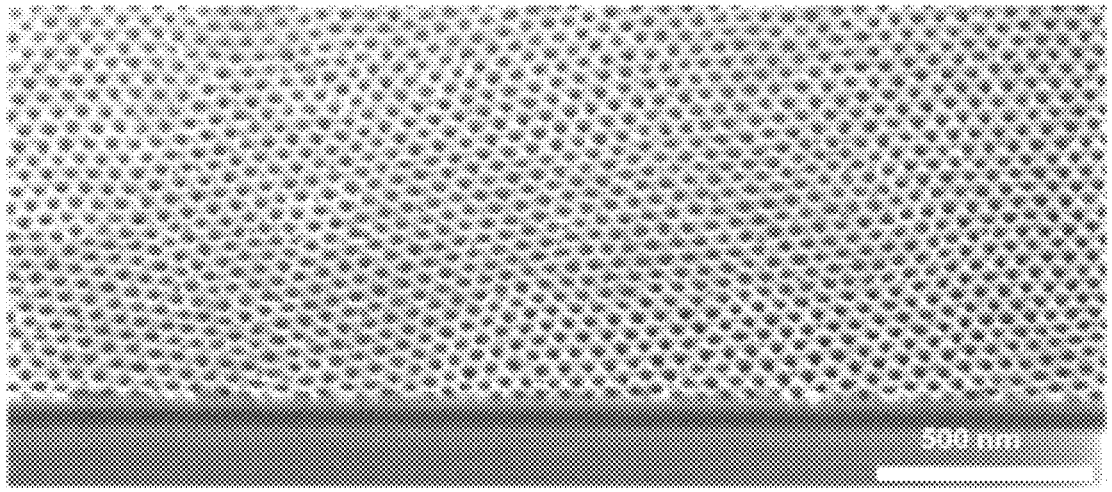
FIG. 1c is an SEM photograph after formation of silicon oxide nanohole patterns on the bottom of the block copolymer thin film by reactive ion etching and oxygen plasma treatment, after selective removal of soft segments in FIG. 1b.

FIG. 1a is an AFM photograph after formation of a block copolymer-1 thin film having a nanostructure formed by solvent annealing, confirming that cylindrical nanopatterns were well-arranged in a 2-dimensional hexagonal shape. FIG. 1b is an SEM photograph after selective removal of soft segments from the block copolymer-1 thin film by UV irradiation, confirming that black cylindrical nanopatterns from which the soft segments were selectively removed are well-arranged in a 2-dimensional hexagonal shape. At this time, it was confirmed that the diameter and spacing (pitch)

of the cylindrical nanopatterns were about 25 nm and 45 nm, respectively. FIG. 1c is an SEM photograph showing the surface and cross section after formation of silicon oxide nanopatterns on the bottom of the block copolymer-1 thin film by reactive ion etching and oxygen plasma treatment, after selective removal of soft segments. According to FIG. 1c, it was confirmed that nanohole patterns including nanoholes on silicon oxide are vertically well-arranged in a hexagonal shape on a silicon wafer substrate having a wide area (3×2 μm). At this time, it was confirmed that the diameter and spacing (pitch) of the nanoholes were about 25 nm and 45 nm, respectively.

Example 6

Formation of Silicon Oxide Nanodot Pattern (Nanodot-1) Using Block Copolymer-1

Silicon oxide nanopatterns were formed in the same manner as in Example 5, except that a thin film having a nanostructure was put in a vial containing 0.4 wt % $RuO_4$ liquid to adsorb $RuO_4$ on the thin film. These nanopatterns were confirmed to be nanodot patterns including silicon oxide nanodots.

Figure 2A:
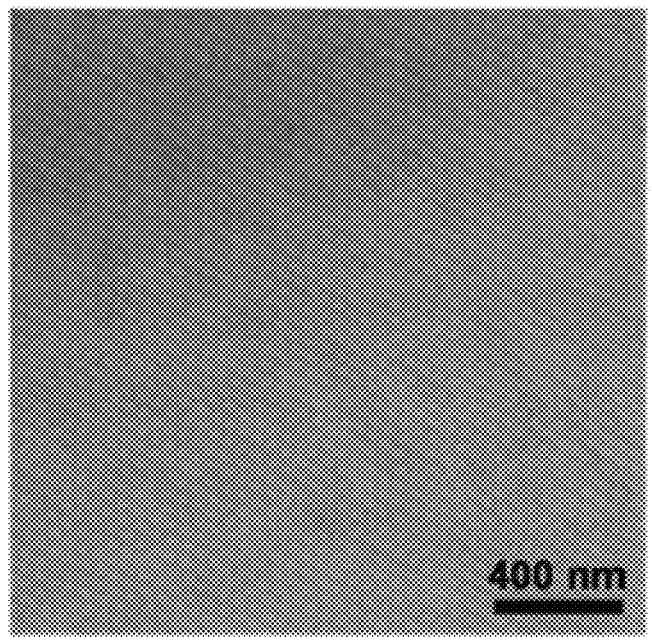
FIG. 2a is an SEM photograph after selective removal of soft segments from the block copolymer thin film by UV irradiation in Example 6.
Figure 2B:
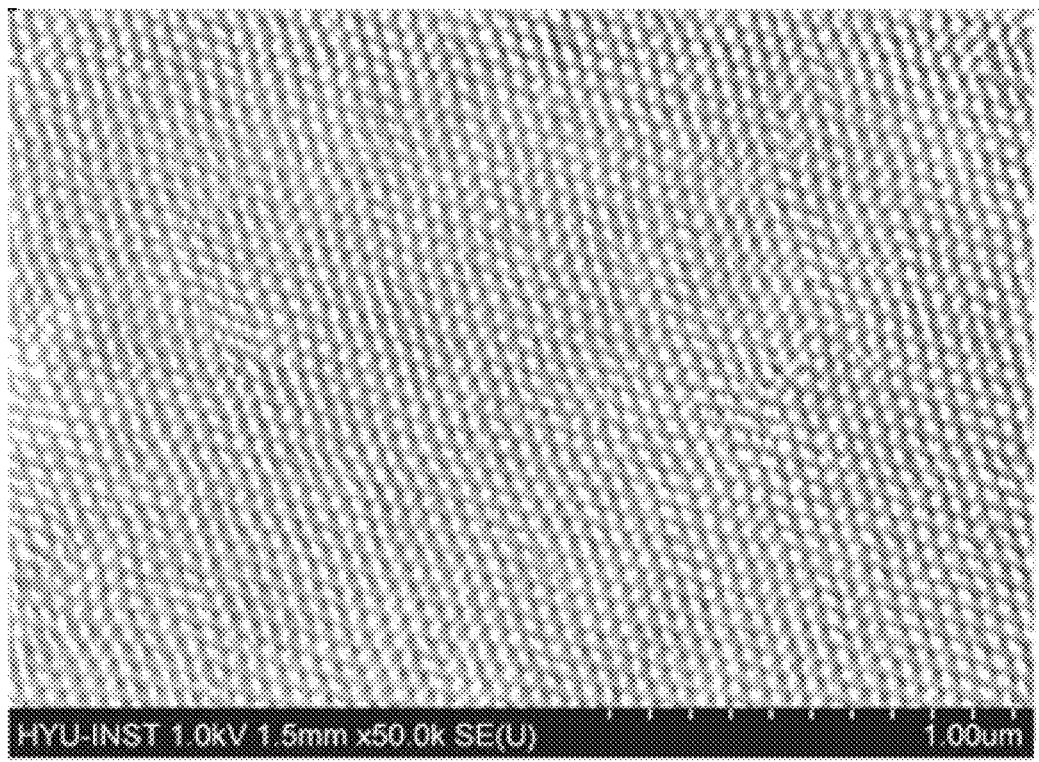
Figure 2C:
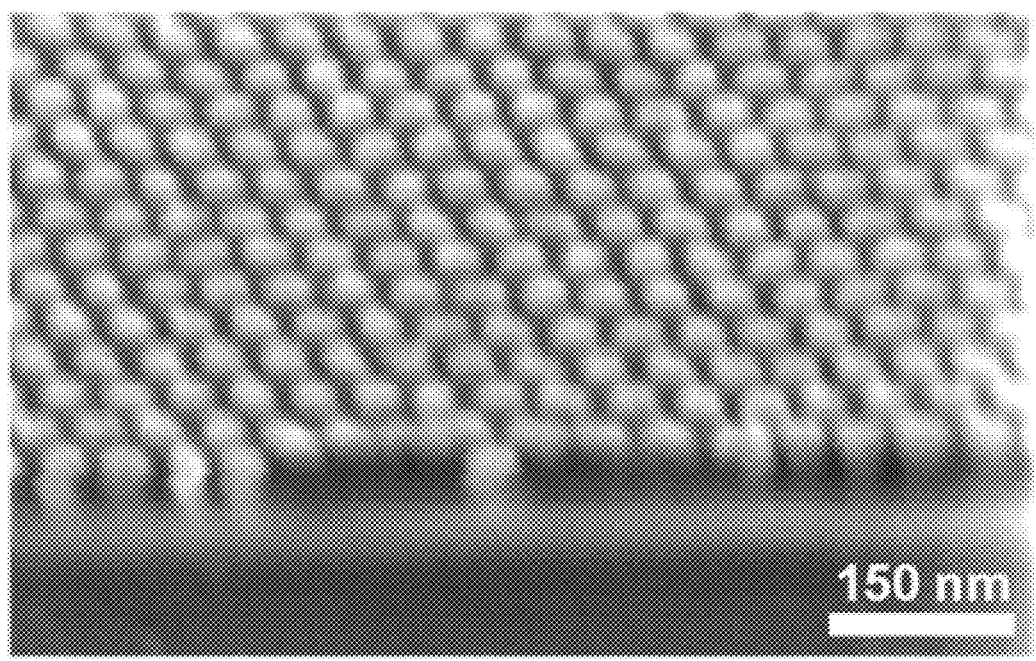
FIG. 2c is an SEM photograph of the surface and cross section of the resultant from nanodot pattern formation of FIG. 2b.

FIG. 2a is an SEM photograph after formation of a block copolymer-1 thin film having a nanostructure and then selective removal of soft segments therefrom by UV irradiation, confirming that polyDOPAM constituting hard segments of the block copolymer are well-arranged in a 2-dimensional hexagonal nanodot-shaped pattern. At this time, it was confirmed that the diameter and spacing of the nanodots constituting the nanodot patterns were about 25 nm and 45 nm, respectively. FIG. 2b is an SEM photograph after formation of silicon oxide nanopatterns on the bottom of the block copolymer-1 thin film by reactive ion etching and oxygen plasma treatment, after selective removal of soft segments. According to FIG. 2b, it was confirmed that nanohole patterns including silicon oxide nanodots are vertically well-arranged in a hexagonal shape on a silicon wafer substrate having a wide area (3×2 μm). At this time, it was confirmed that the diameter and pitch of the nanodots were about 25 nm and 45 nm, respectively. FIG. 2c is an SEM photograph of the surface and cross section of the resultant from nanodot pattern formation of FIG. 2b, confirming that the nanodots have a very high aspect ratio of about 1.5.

Example 7

Formation of Silicon Oxide Nanodot Pattern (Nanodot-2) Using Block Copolymer-1

Silicon oxide nanopatterns were formed in the same manner as in Example 5, except that 2.668 mL of 3.5M hydrochloric acid aqueous solution was used instead of the acetic acid solution, after UV irradiation. However, in Example 7, the reactive ion etching and oxygen plasma treatment were repeated twice under the same conditions. These nanopatterns were confirmed to be nanodot patterns having silicon oxide nanodots.

Figure 3A:
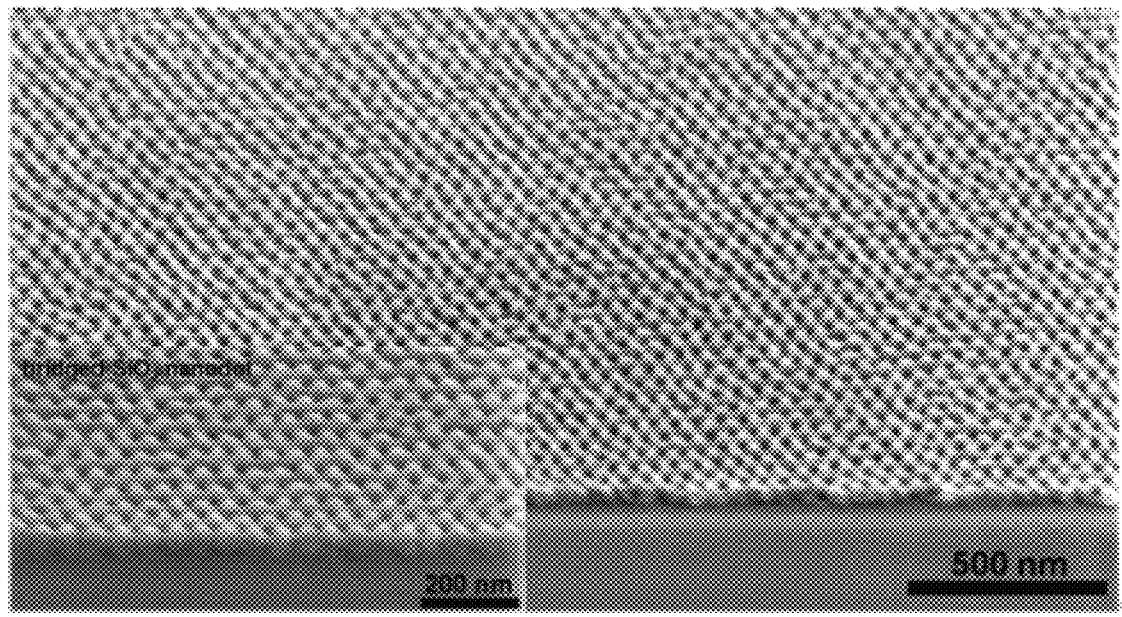
FIG. 3a is an SEM photograph after formation of silicon oxide nanodot patterns on the bottom of the block copolymer thin film by one cycle of reactive ion etching and oxygen plasma treatment in Example 7.
Figure 3B:
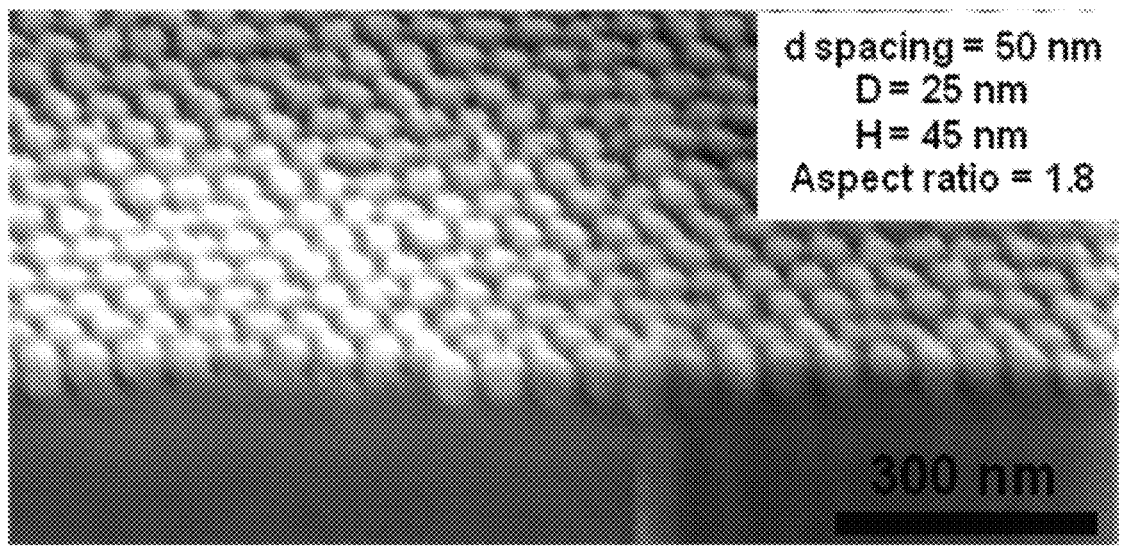
FIG. 3b is an SEM photograph after formation of silicon oxide nanodot patterns on the bottom of the block copolymer thin film by two cycles of reactive ion etching and oxygen plasma treatment in Example 7.

FIG. 3a is an SEM photograph after formation of silicon oxide nanodot patterns on the bottom of the block copolymer thin film by one cycle of reactive ion etching and oxygen plasma treatment, and FIG. 3b is an SEM photograph after formation of silicon oxide nanodot patterns by two cycles of reactive ion etching and oxygen plasma treatment. In FIG. 3a, the nanodots were confirmed to be partially connected to each other. In contrast, in FIG. 3b, the nanodots constituting the nanodot patterns were not connected to each other, but were formed independently. Further, it was confirmed that the diameter and spacing of the nanodots were about 25 nm and 45 nm, respectively. It was also confirmed that each of the nanodots has a very high aspect ratio of about 1.8 and these nanodots were well-arranged 3-dimensionally.

Example 8

Formation of Silicon Oxide Nanopattern (Including Both Nanohole/Nanodot) Using Block Copolymer-1

Figure 4:
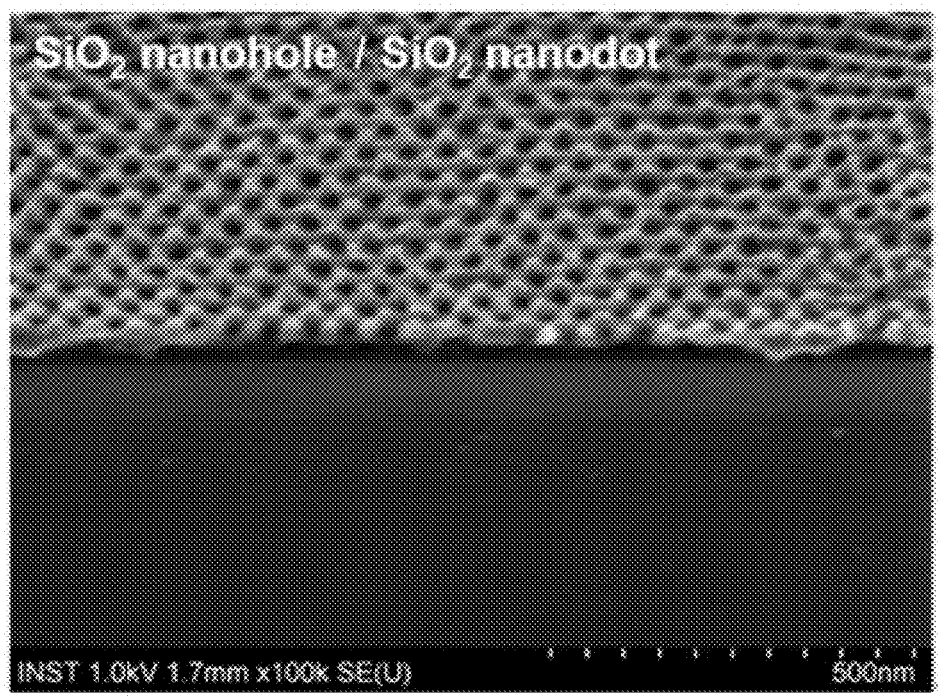
FIG. 4 is an SEM photograph after formation of silicon oxide nanopatterns (containing both nanodots and nanoholes) in Example 8.

Silicon oxide nanopatterns were formed in the same manner as in Example 5, except that a thin film having a nanostructure was put in an acetic acid solution for a longer time of 40 minutes, after UV irradiation. Referring to FIG. 4, these nanopatterns were confirmed to be silicon oxide nanopatterns including both silicon oxide nanoholes and nanodots.

Example 9

Formation of Silicon Oxide Nanodot Pattern (Nanodot-3) Using Block Copolymer-2

Silicon oxide nanopatterns were formed in the same manner as in Example 5, except that block copolymer-2 prepared in Example 4 was used and a thin film having a nanostructure was put in a vial containing 0.4 wt % $Ru_4O_4$ liquid to adsorb $RuO_4$ thereto for 4 minutes. These nanopatterns were confirmed to be nanodot patterns including silicon oxide nanodots.

Figure 5A:
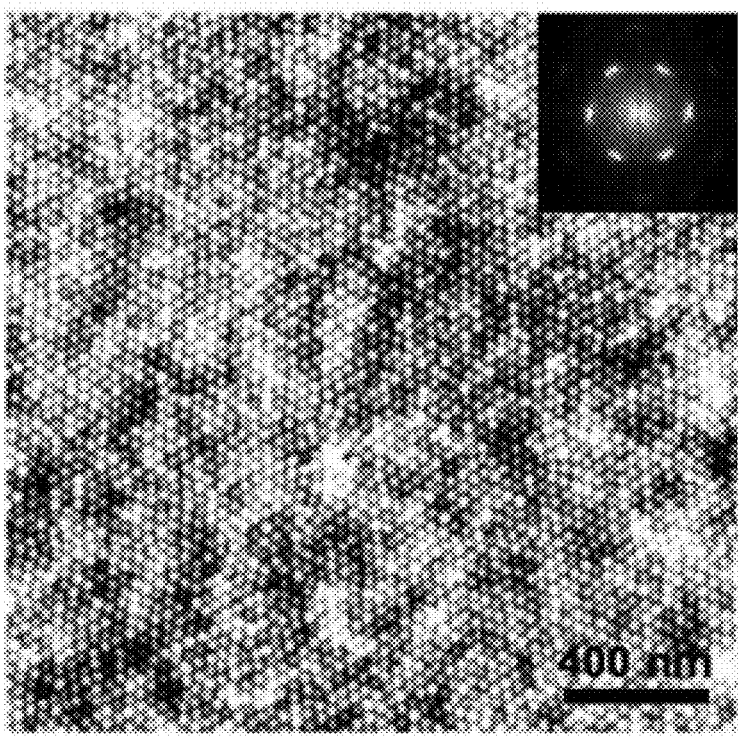
FIG. 5a is an AFM photograph of a nanostructure after formation of a block copolymer thin film by solvent annealing in Example 9.
Figure 5B:
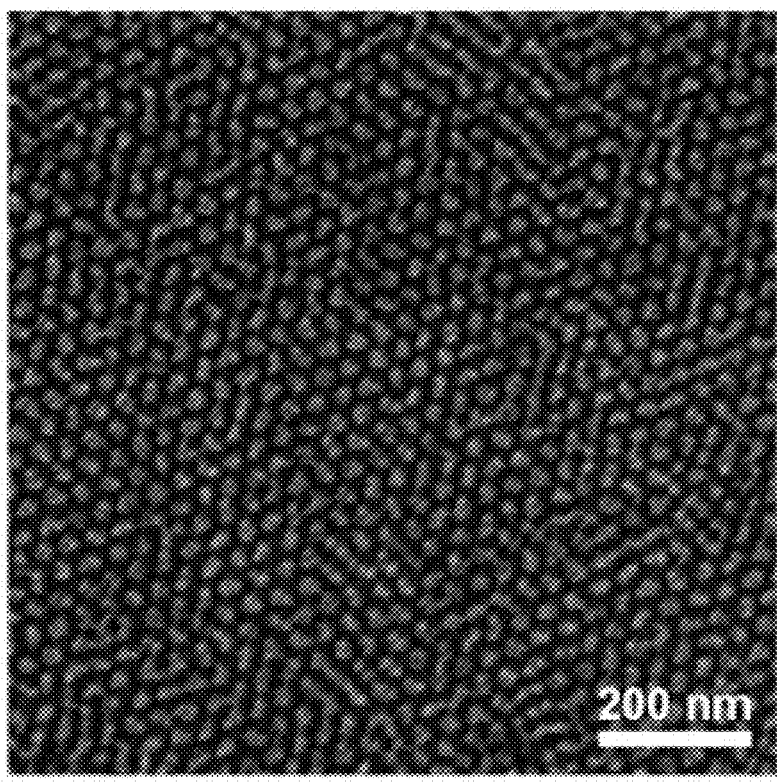
Figure 6A:
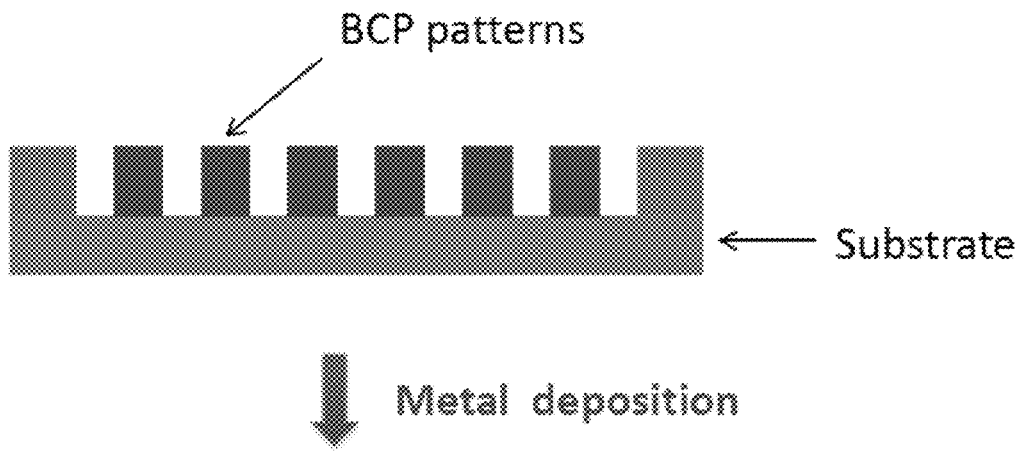
FIG. 6a is a schematic diagram showing a method for forming nanodot-shaped metal nanopatterns according to one embodiment of the present invention.
Figure 6B:
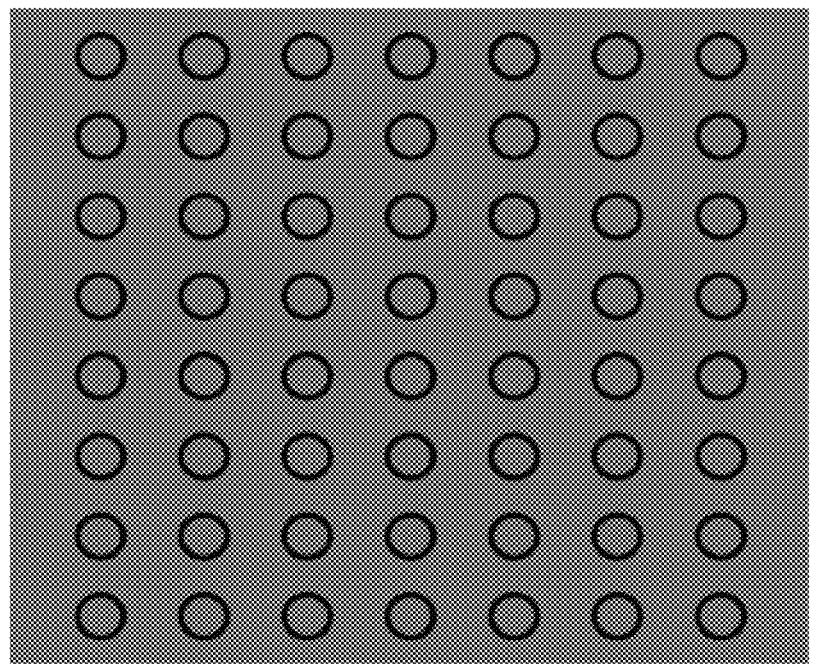
Figure 7A:
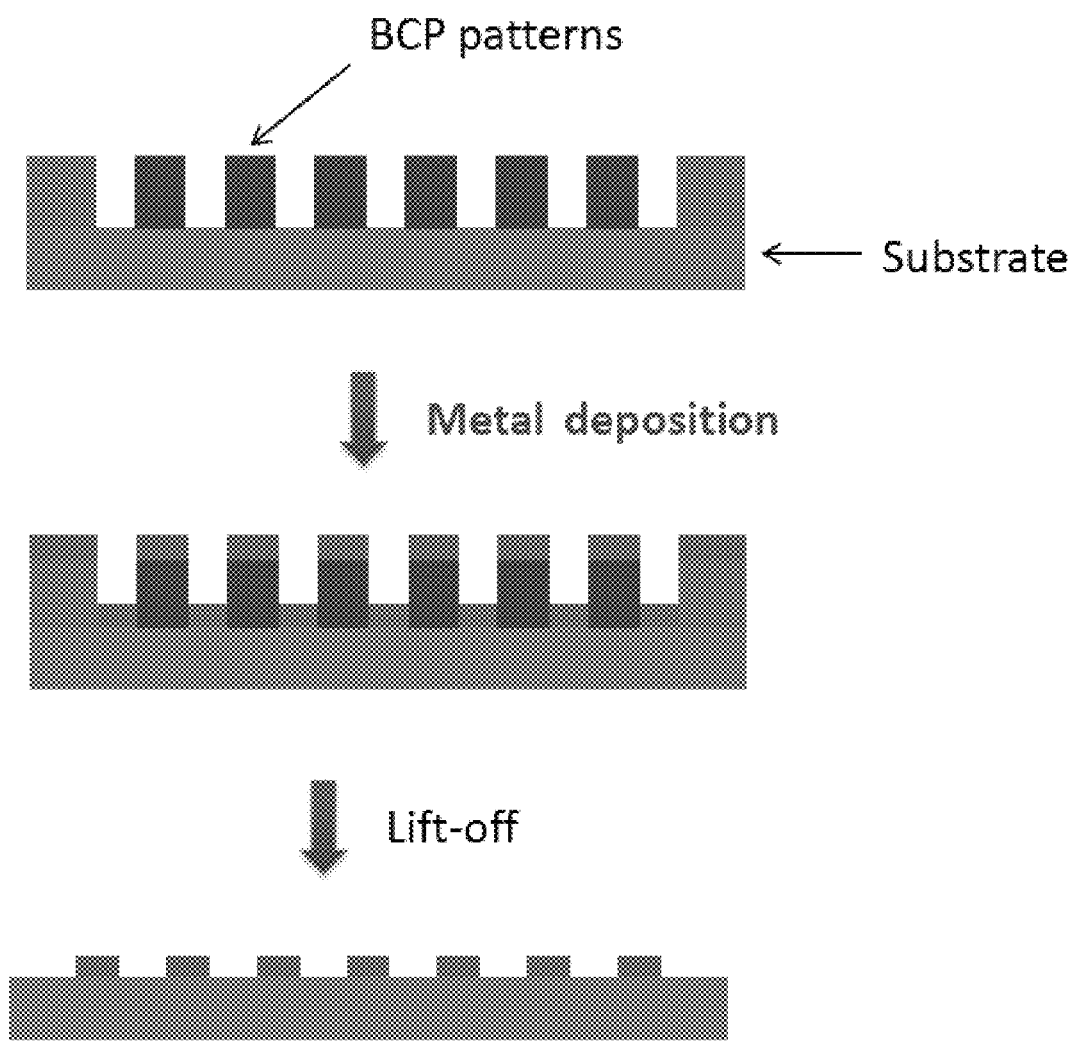
FIG. 7a is a schematic diagram showing a method for forming nanodot-shaped metal nanopatterns according to another embodiment of the present invention.
Figure 7B:
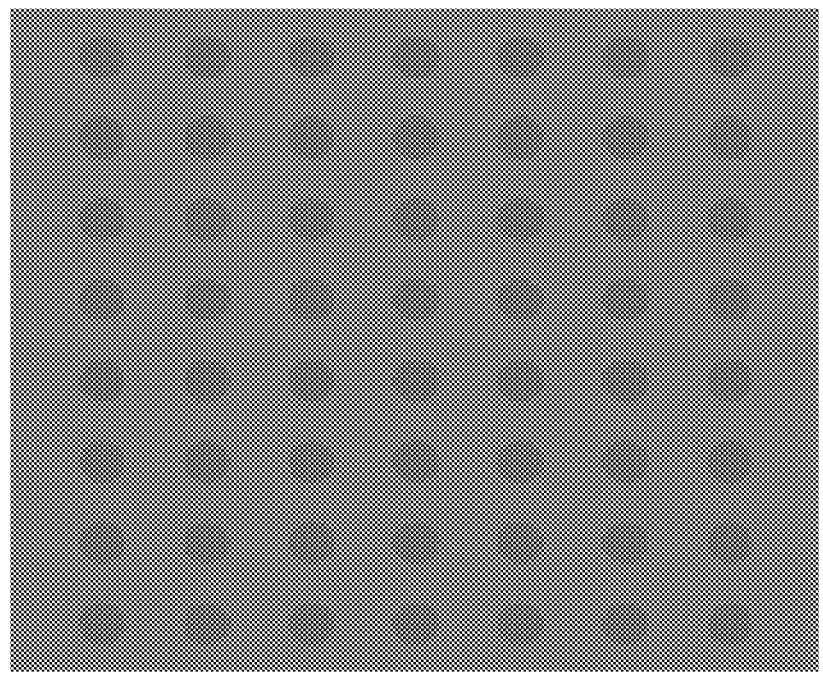
Figure 8:
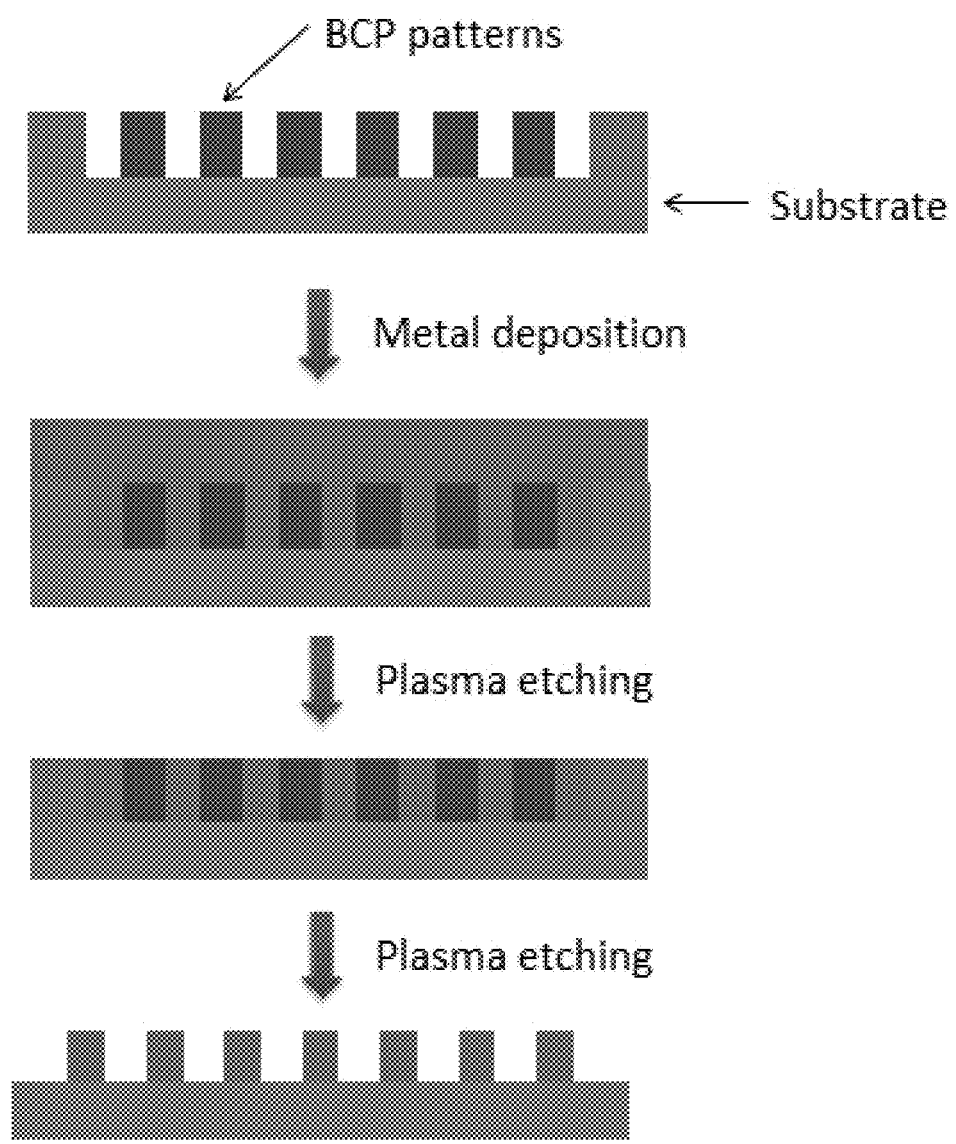
FIG. 8 is a schematic diagram showing a method for forming nanodot-shaped metal nanopatterns according to still another embodiment of the present invention.

FIG. 5a is an AFM photograph after formation of a block copolymer-2 thin film having a nanostructure by solvent annealing, confirming that the cylindrical nanopatterns are well-arranged in a 2-dimensional hexagonal shape. At this time, it was confirmed that the diameter and pitch of the cylindrical nanopatterns were about 15 nm and 31 nm, respectively. FIG. 5b is an SEM photograph after formation of silicon oxide nanopatterns on the bottom of the block copolymer-2 thin film by reactive ion etching and oxygen plasma treatment, after selective removal of soft segments from the thin film. According to FIG. 5b, it was confirmed that nanohole patterns including silicon oxide nanodots are well-arranged in a hexagonal shape on the silicon wafer substrate. At this time, it was confirmed that the diameter and pitch of the nanodots were about 15 nm and 31 nm, respectively.

Example 10

Manufacture of Ferromagnetic Metal Nanodot Pattern

Silicon oxide nanohole patterns were formed using the block copolymer-2 prepared in Example 4 in the same manner as in Example 5. Subsequently, ferromagnetic Co metal or $Ni_{0.8}Fe_{0.2}$ permalloy was deposited to form a ferromagnetic metal thin film by electron beam evaporation or sputtering. At this time, the ferromagnetic metal thin film was deposited and formed at a thickness of about 70 nm which was thicker than the nanohole patterns so that the patterns were embedded therein.

After formation of the ferromagnetic metal thin film, it was etched by $CF_4$ vacuum plasma with a power of 100 to 500 W, so as to selectively remove the metal present on the block copolymer nanopatterns constituting the skeleton of the nanohole patterns and the block copolymer nanopatterns. At this time, when the single plasma etching process was conducted, the metal present on the block copolymer nanopatterns were removed overall, and once the block copolymer nanopatterns were exposed, the block copolymer nanopatterns were etched and removed more quickly than the metal.

Figure 9A:
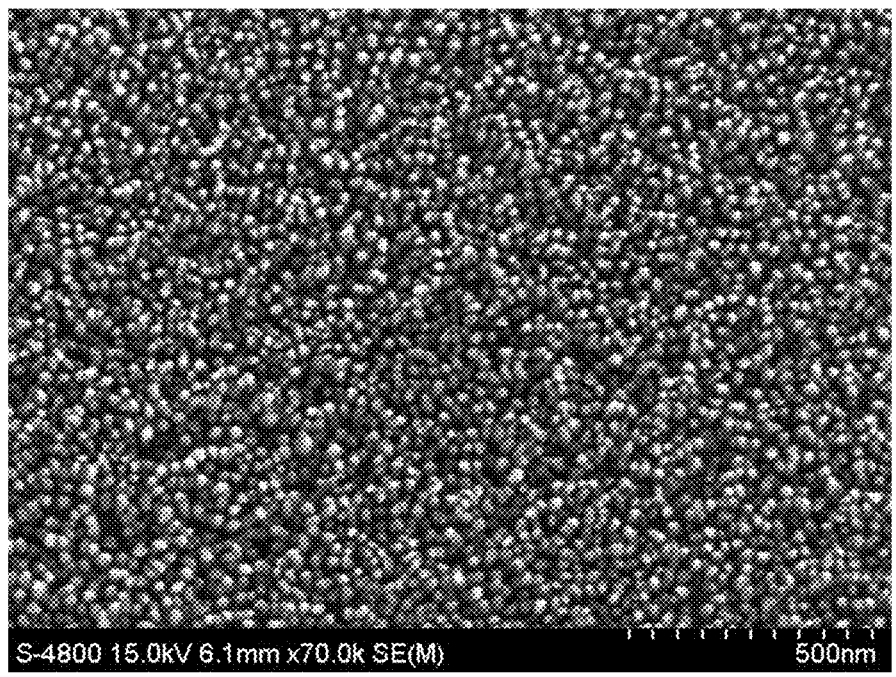
FIG. 9a is an SEM photograph after formation of ferromagnetic Co nanopatterns (nanodots) by the method of Example 10, which is schematically illustrated in FIG. 8.
Figure 9B:
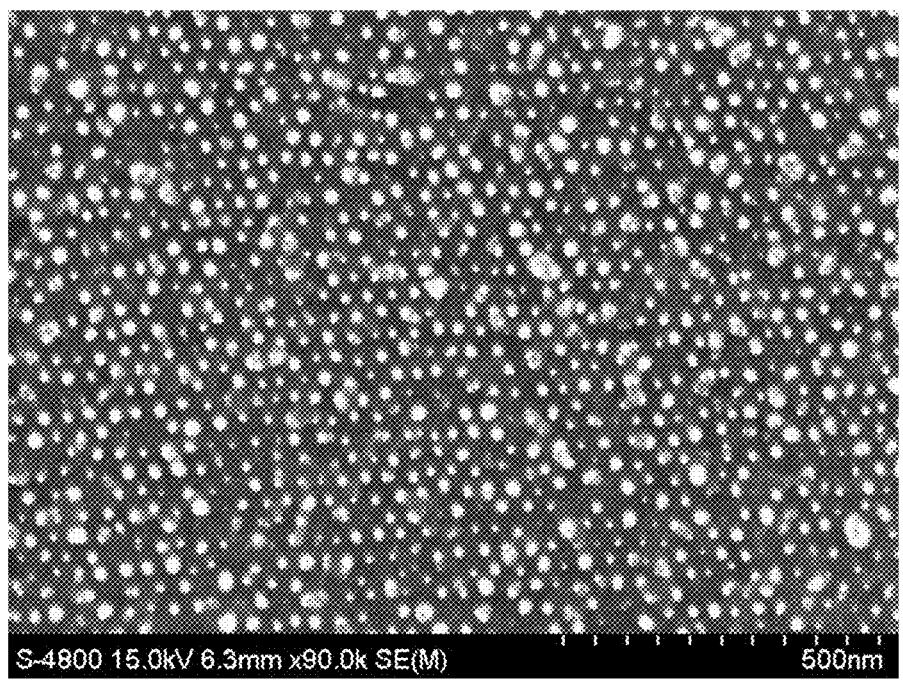
FIG. 9b is an SEM photograph after formation of ferromagnetic $Ni_{0.8}Fe_{0.2}$ nanopatterns (nanodots) by the method of Example 10, which is schematically illustrated in FIG. 8.

As a result, nanodot-shaped ferromagnetic metal nanopatterns were formed, which are completely different from the nanohole patterns initially formed. The SEM photographs of the ferromagnetic metal nanopatterns are as shown in FIGS. 9a and 9b. FIG. 9a is an SEM photograph after formation of nanopatterns using a ferromagnetic Co metal, and FIG. 9b is an SEM photograph after formation of nanopatterns using a ferromagnetic $Ni_{0.8}Fe_{0.2}$ permalloy, confirming that nanodots having a diameter of about 15 nm to 25 nm were relatively regularly formed on the large area substrate. It is expected that the nanodot-shaped ferromagnetic metal nanopatterns can be applied to next-generation large capacity-magnetic recording media for information storage.

These examples confirmed that excellent silicon oxide nanodot or nanohole patterns can be very easily formed by forming a block copolymer thin film by solvent annealing, etc. to form a nanostructure, by selectively removing soft segments by UV irradiation, and by conducting reactive ion etching of silicon oxide using the block copolymer thin film as a mask. It was also confirmed that nanodot-shaped ferromagnetic metal nanopatterns which can be applied to next-generation large capacity-magnetic recording media for information storage can be easily formed by using the nanohole patterns, etc.

In particular, it was confirmed that desired nanopatterns (nanodot, nanohole or nanohole and nanodot-coexisted patterns) can be easily formed, depending on the kind or concentration of an acid which is treated to remove soft segments after UV irradiation, the deionized water washing time after acid treatment, the kind, concentration or time of metal oxide adsorbed onto the thin film from which soft segments are removed, such as $RuO_4$ or $OsO_4$, or conditions or the number of times of the reactive ion etching and oxygen plasma treatment process.

This is a new phenomenon that has not been observed in the known method for forming the nanostructure or nanopattern using the block copolymer thin film, and this is likely to be attributed to polymer chain structure and reactivity of the unique hard segments included in the block copolymer of Examples, for example, polyDOPAM. That is, after selective removal of the soft segments by UV irradiation, the polymer chains of the hard segments that remain in the block copolymer thin film, for example, polyDOPAM, undergo chemical reactions according to acid treatment conditions, metal oxide treatment conditions, etching or oxygen plasma treatment conditions, etc., for example, to convert the nanohole-shaped pattern into the nanodot-shaped pattern. Accordingly, in Examples, silicon oxide nanopatterns can be easily formed in a desired shape (nanodot, nanohole, or nanohole and nanodot-coexisted pattern).

The invention claimed is:

1. A method for forming a silicon oxide nanopattern, comprising the steps of:
    forming a block copolymer thin film including hard segments containing a repeating unit of Chemical Formula 1 and soft segments containing a (meth)acrylate-based repeating unit of Chemical Formula 2 on silicon oxide of a substrate;
    selectively removing the soft segments from the block copolymer thin film; and
    conducting reactive ion etching of silicon oxide using the block copolymer thin film from which the soft segments are removed, as a mask to form a silicon oxide nanodot or nanohole pattern,
    wherein in the block copolymer thin film, the soft segments are self-arranged in cylindrical forms on the hard segments:

[Chemical Formula 1]

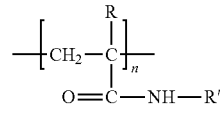

[Chemical Formula 2]

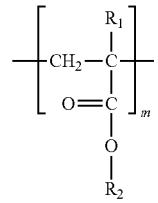

in Chemical Formula 1, n is an integer of 5 to 600, R is hydrogen or methyl, R' is X,

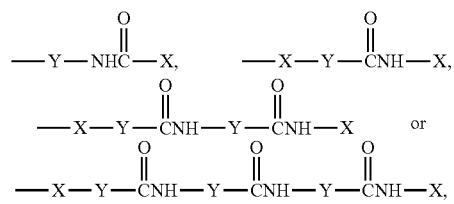

X is —Z—R", Y is alkylene having 1 to 10 carbon atoms, Z is arylene having 6 to 20 carbon atoms, R" is linear or branched hydrocarbon having 10 to 20 carbon atoms, or linear or branched perfluorohydrocarbon having 10 to 20 carbon atoms, and in Chemical Formula 2, m is an integer of 30 to 1000, $R_1$ is hydrogen or methyl, and $R_2$ is alkyl having 1 to 20 carbon atoms.

2. The method of claim 1, wherein the block copolymer includes 40 to 90 wt % of the hard segment and 60 to 10 wt % of the soft segment.

3. The method of claim 1, wherein the block copolymer includes crystalline hard segments and amorphous soft segments.

4. The method of claim 1, wherein the nanodot pattern has a shape in which silicon oxide nanodots having a diameter of 5 to 60 nm are formed at a spacing of 10 to 100 nm.

5. The method of claim 1, wherein the nanohole pattern has a shape in which silicon oxide nanoholes having a diameter of 5 to 60 nm are formed at a spacing of 10 to 100 nm.

6. The method of claim 1, wherein the nanodot or nanohole pattern includes both the silicon oxide nanodots and silicon oxide nanoholes.

7. The method of claim 1, wherein the nanodot or nanohole pattern includes silicon oxide nanodots or silicon oxide nanoholes having an aspect ratio of 1.1 or more.

8. The method of claim 1, wherein the step of forming the block copolymer thin film includes the steps of:
  applying a block copolymer solution to a substrate so as to form a thin film; and conducting orientation of each segment of the block copolymer by solvent-annealing of the applied thin film, or by heat-treatment of the thin film at a temperate higher than a melting point ($T_m$) of the hard segment and a glass transition temperature ($T_g$) of the soft segment.

9. The method of claim 8, wherein the solvent annealing step is conducted by solvent annealing of the applied thin film in a mixed solvent of a non-polar solvent and a polar solvent at room temperature.

10. The method of claim 1, further comprising the step of adsorbing a material onto the thin film, in which the material is selectively adsorbed onto the hard segment, after forming the block copolymer thin film.

11. The method of claim 1, wherein the step of selectively removing the soft segments includes a step of removing the soft segments by UV irradiation of the block copolymer thin film.

12. The method of claim 11, wherein the UV irradiation step is conducted by irradiating UV of 254 nm wavelength for 1 minute to 60 minutes.

13. The method of claim 11, further comprising the step of removing UV-decomposed soft segments by acid treatment of the block copolymer thin film, after the UV irradiation step.

14. The method of claim 13, wherein in the acid treatment step, an aqueous solution of hydrochloric acid, acetic acid or trifluoroacetic acid is used.

15. The method of claim 14, further comprising the step of washing the block copolymer thin film with deionized water, after the acid treatment step.

16. The method of claim 1, wherein the reactive ion etching step is conducted using $CF_4$/Ar gas ion.

17. The method of claim 16, further comprising the step of removing the block copolymer thin film by oxygen plasma treatment, after the reactive ion etching step.

* * * * *